(12) United States Patent
Choi et al.

(10) Patent No.: US 10,150,912 B2
(45) Date of Patent: Dec. 11, 2018

(54) RED PHOSPHOR, WHITE LIGHT EMITTING APPARATUS, DISPLAY APPARATUS, AND LIGHTING APPARATUS

(71) Applicant: SAMSUNG ELECTRONICS CO., LTD., Suwon-si (KR)

(72) Inventors: Sung Woo Choi, Suwon-si (KR); Sung Hak Jo, Suwon-si (KR); Sun Yeol Choi, Suwon-si (KR); Jung Eun Yoon, Gwangju-si (KR); Chul Soo Yoon, Suwon-si (KR); Tae Young Choi, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 192 days.

(21) Appl. No.: 14/963,401

(22) Filed: Dec. 9, 2015

(65) Prior Publication Data

US 2016/0177178 A1 Jun. 23, 2016

(30) Foreign Application Priority Data

Dec. 17, 2014 (KR) .................. 10-2014-0182682

(51) Int. Cl.
| | | |
|---|---|---|
| *C09K 11/71* | (2006.01) | |
| *F21V 8/00* | (2006.01) | |
| *H01L 33/50* | (2010.01) | |
| *F21K 9/64* | (2016.01) | |
| *H01L 25/075* | (2006.01) | |
| *F21K 9/232* | (2016.01) | |
| *F21Y 115/10* | (2016.01) | |

(52) U.S. Cl.
CPC .............. *C09K 11/71* (2013.01); *F21K 9/64* (2016.08); *G02B 6/005* (2013.01); *G02B 6/0026* (2013.01); *H01L 25/0753* (2013.01); *H01L 33/502* (2013.01); *F21K 9/232* (2016.08); *F21Y 2115/10* (2016.08); *Y02B 20/181* (2013.01)

(58) Field of Classification Search
CPC ......... C09K 11/71; C09K 11/08; F21K 9/232; F21K 9/64; F21Y 2115/10; G02B 6/0026; G02B 6/005; H01L 25/0753; H01L 33/502; Y02B 20/181
USPC .......................... 362/606, 97.1, 293; 257/98; 252/301.4 P, 301 F
See application file for complete search history.

(56) References Cited

U.S. PATENT DOCUMENTS

| | | | |
|---|---|---|---|
| 6,372,608 B1 | 4/2002 | Shimoda et al. | |
| 6,455,213 B1 * | 9/2002 | Lee ........ | H01J 9/2271 430/23 |
| 6,645,830 B2 | 11/2003 | Shimoda et al. | |

(Continued)

FOREIGN PATENT DOCUMENTS

| | | |
|---|---|---|
| JP | 3921545 B2 | 5/2007 |
| JP | 2013-127055 A | 6/2013 |

(Continued)

*Primary Examiner* — Tsion Tumebo
(74) *Attorney, Agent, or Firm* — Sughrue Mion, PLLC

(57) ABSTRACT

There is provided a red phosphor that may include a nitride represented by a formula of $(Sr_{1-x-y}Ba_xEu_y)_2Si_5N_8$, wherein $0<x<0.7$, and $0<y<0.1$. The red phosphor may emit light having a peak wavelength in a range of 600 nm to 630 nm when irradiated by an excitation source and the excitation source may be a blue light source having a dominant wavelength in a range of 420 nm to 470 nm.

17 Claims, 14 Drawing Sheets

(56) References Cited

U.S. PATENT DOCUMENTS

| | | |
|---|---|---|
| 6,682,663 B2 | 1/2004 | Botty et al. |
| RE38,466 E | 3/2004 | Inoue et al. |
| 6,818,465 B2 | 11/2004 | Biwa et al. |
| 6,818,530 B2 | 11/2004 | Shimoda et al. |
| 6,858,081 B2 | 2/2005 | Biwa et al. |
| 6,967,353 B2 | 11/2005 | Suzuki et al. |
| 7,002,182 B2 | 2/2006 | Okuyama et al. |
| 7,084,420 B2 | 8/2006 | Kim et al. |
| 7,087,932 B2 | 8/2006 | Okuyama et al. |
| 7,154,124 B2 | 12/2006 | Han et al. |
| 7,208,725 B2 | 4/2007 | Sherrer et al. |
| 7,288,758 B2 | 10/2007 | Sherrer et al. |
| 7,319,044 B2 | 1/2008 | Han et al. |
| 7,501,656 B2 | 3/2009 | Han et al. |
| 7,709,857 B2 | 5/2010 | Kim et al. |
| 7,759,140 B2 | 7/2010 | Lee et al. |
| 7,781,727 B2 | 8/2010 | Sherrer et al. |
| 7,790,482 B2 | 9/2010 | Han et al. |
| 7,940,350 B2 | 5/2011 | Jeong |
| 7,959,312 B2 | 6/2011 | Yoo et al. |
| 7,964,881 B2 | 6/2011 | Choi et al. |
| 7,985,976 B2 | 7/2011 | Choi et al. |
| 7,994,525 B2 | 8/2011 | Lee et al. |
| 8,008,683 B2 | 8/2011 | Choi et al. |
| 8,013,352 B2 | 9/2011 | Lee et al. |
| 8,049,161 B2 | 11/2011 | Sherrer et al. |
| 8,129,711 B2 | 3/2012 | Kang et al. |
| 8,179,938 B2 | 5/2012 | Kim |
| 8,263,987 B2 | 9/2012 | Choi et al. |
| 8,324,646 B2 | 12/2012 | Lee et al. |
| 8,399,944 B2 | 3/2013 | Kwak et al. |
| 8,432,511 B2 | 4/2013 | Jeong |
| 8,459,832 B2 | 6/2013 | Kim |
| 8,502,242 B2 | 8/2013 | Kim |
| 8,536,604 B2 | 9/2013 | Kwak et al. |
| 8,551,360 B2 | 10/2013 | Duan et al. |
| 8,735,931 B2 | 5/2014 | Han et al. |
| 8,766,295 B2 | 7/2014 | Kim |
| 2003/0020101 A1 | 1/2003 | Bogner et al. |
| 2004/0135504 A1 | 7/2004 | Tamaki et al. |
| 2005/0161690 A1 | 7/2005 | Lai et al. |
| 2005/0189863 A1 | 9/2005 | Nagatomi et al. |
| 2005/0230689 A1 | 10/2005 | Setlur et al. |
| 2006/0038477 A1 | 2/2006 | Tamaki et al. |
| 2006/0124947 A1* | 6/2006 | Mueller ............ C09K 11/0883 257/98 |
| 2007/0108896 A1 | 5/2007 | Hirosaki |
| 2008/0089825 A1 | 4/2008 | Tamaki et al. |
| 2008/0160218 A1* | 7/2008 | Imamura ............ C09K 11/7774 428/1.1 |
| 2008/0231171 A1* | 9/2008 | Schmidt ............ C09K 11/7734 313/503 |
| 2008/0303407 A1 | 12/2008 | Brunner et al. |
| 2009/0072708 A1 | 3/2009 | Tamaki et al. |
| 2009/0140205 A1* | 6/2009 | Kijima ................ C04B 35/581 252/301.6 R |
| 2009/0230840 A1 | 9/2009 | Tamaki et al. |
| 2009/0236963 A1* | 9/2009 | Nagatomi .......... C09K 11/7721 313/483 |
| 2009/0284132 A1 | 11/2009 | Tamaki et al. |
| 2009/0309485 A1 | 12/2009 | Tamaki et al. |
| 2010/0012964 A1* | 1/2010 | Copic .................. C04B 35/584 257/98 |
| 2010/0231121 A1* | 9/2010 | Kaneda .................. C01B 33/20 313/503 |
| 2011/0031523 A1* | 2/2011 | Ishii .................. C09K 11/7734 257/98 |
| 2011/0031874 A1 | 2/2011 | Hosokawa et al. |
| 2013/0043783 A1 | 2/2013 | Lee et al. |
| 2013/0168605 A1 | 7/2013 | Li et al. |
| 2013/0234589 A1 | 9/2013 | Tao et al. |
| 2015/0002013 A1* | 1/2015 | Liu .................... C09K 11/7728 313/503 |

FOREIGN PATENT DOCUMENTS

| | | |
|---|---|---|
| JP | 2014-13943 A | 1/2014 |
| JP | 5471021 B2 | 4/2014 |
| KR | 10-2005-0077247 A | 8/2005 |
| KR | 10-0702757 B1 | 4/2007 |
| KR | 10-2009-0089384 A | 8/2009 |
| KR | 10-1394618 B1 | 5/2014 |

* cited by examiner

RED PHOSPHOR, WHITE LIGHT EMITTING APPARATUS, DISPLAY APPARATUS, AND LIGHTING APPARATUS

CROSS-REFERENCE TO RELATED APPLICATION

This application claims priority from Korean Patent Application No. 10-2014-0182682, filed on Dec. 17, 2014, in the Korean Intellectual Property Office, the disclosure of which is incorporated herein in its entirety by reference.

BACKGROUND

1. Field

Apparatuses consistent with exemplary embodiments relate to a red phosphor, white light emitting apparatus, a display apparatus, and a lighting apparatus, and more particularly, to a red phosphor having improved brightness and capable of maintaining reliability under a higher temperature, higher humidity environment, a white light emitting apparatus, a display apparatus, and a lighting apparatus using the red phosphor.

2. Description of the Related Art

Phosphors that convert wavelengths of light may be used to convert light having specific wavelengths generated by a variety of light sources into light having desired wavelengths. In particular, light-emitting diodes (LEDs), among a variety of light sources, have low driving power consumption and excellent light efficiency, and thus are widely used in a backlight of liquid crystal displays (LCDs), lighting apparatuses for homes, and lighting apparatuses for homes. Accordingly, phosphors have drawn much attention in manufacturing white light-emitting apparatuses.

White light-emitting apparatuses may be manufactured by applying one or more kinds of phosphors (e.g. a yellow phosphor, a red phosphor, and/or a blue phosphor) to a blue or ultraviolet (UV) LED chip. It is desirable that the phosphors have a higher level of reliability even in a higher temperature, higher humidity environment, as well as excellent light emitting characteristics.

SUMMARY

One or more exemplary embodiments may provide a red phosphor having improved brightness and capable of maintaining reliability under a higher temperature, higher humidity environment, a white light emitting apparatus, a display apparatus, and a lighting apparatus using the red phosphor.

According to an aspect of an exemplary embodiment, a red phosphor may include a nitride represented by a formula $(Sr_{1-x-y}Ba_xEu_y)_2Si_5N_8$, wherein $0<x<0.7$, and $0<y<0.1$.

The red phosphor may emit light having a peak wavelength in a range of 600 nm to 630 nm when irradiated by an excitation source. The excitation source may be a blue light source having a dominant wavelength in a range of 420 nm to 470 nm.

The red phosphor may include oxygen as an impurity, and a content of oxygen may be 1 wt % or less.

In the formula, $0.19<x<0.6$. In the formula, $0.018<x<0.04$.

A median particle size (D50) in a particle size distribution of the red phosphor may be in a range of 10 μm to 25 μm. When a quartile deviation (Q.D.) related to the particle size is defined as (D75−D25)/(D75+D25), the particle size distribution of the red phosphor may satisfy $0.18<Q.D.<0.32$.

According to an aspect of another exemplary embodiment, a white light emitting apparatus may include a semiconductor light-emitting device configured to emit excited light, a red phosphor disposed around the semiconductor light-emitting device and configured to convert a wavelength of at least some of the excited light, and at least one light-emitting component configured to provide light having a different wavelength from the excited light emitted by the semiconductor light-emitting device and light emitted by the red phosphor. The red phosphor may include a nitride represented by a formula $(Sr_{1-x-y}Ba_xEu_y)_2Si_5N_8$, wherein, $0<x<0.7$ and $0<y<0.1$. The at least one light-emitting component may include at least one of another semiconductor light-emitting device and another phosphor.

The semiconductor light-emitting device may include a blue semiconductor light-emitting device having a dominant wavelength in a range of 420 nm to 470 nm.

The at least one light-emitting component may include a green phosphor. The green phosphor may have a peak wavelength in a range of 500 nm to 550 nm.

For example, the green phosphor may include at least one from among an oxide-based phosphor represented by a formula of $M_3Al_5O_{12}$, a β-sialon phosphor represented by a formula of $Si_{6-z}Al_zO_zN_{8-z}$, and a $La_3Si_6N_{11}$:Ce phosphor. Here, M may include at least one group II or group III element selected from the group consisting of Y, Lu, Gd, Ga, Be, Mg, Ca, Sr, Ba, Zn, Eu, and Ce.

The at least one light-emitting component may include a yellow phosphor or a yellowish orange phosphor. The yellow phosphor or the yellowish orange phosphor may have a peak wavelength in a range of 550 nm to 600 nm.

For example, the yellow phosphor may include at least one from among a silicate-based phosphor, a garnet-based phosphor, and a nitride-based phosphor, and the yellowish orange phosphor may include α-SiAlON:Re phosphor.

According to an aspect of still another exemplary embodiment, a method of forming a red phosphor may include measuring raw powders including a Sr-containing nitride, a Ba-containing nitride, a Si-containing nitride, and a Eu-containing nitride to form a nitride phosphor represented by a formula of $(Sr_{1-x-y}Ba_xEu_y)_2Si_5N_8$ (wherein, $0<x<0.7$ and $0<y<0.1$), mixing the raw powders to form a mixed powder, sintering the mixed powder to obtain a phosphor, grinding a result of the sintering to obtain a phosphor powder having a certain particle size, and cleaning the phosphor powder.

A content of oxygen in the raw powders may be 1 wt % or less. For example, the raw powders may include $Sr_3N_2$, $Ba_3N_2$, EuN, and $Si_3N_4$. In the formula, $0.19<x<0.6$.

Forming of the mixed powder may be performed in a closed space filled with an inert gas. The sintering may be performed in a state in which the mixed powder is disposed in a metal crucible.

The sintering may be performed at a temperature of 1500° C. to 1900° C. under a nitrogen gas atmosphere or a hydrogen/nitrogen mixed gas atmosphere.

The method may further include additionally sintering the cleaned phosphor powder. A sintering temperature and sintering time applied to the additional sintering process may be respectively higher and longer than a sintering temperature and sintering time applied to the sintering the mixed powder.

According to another aspect, a display device may include an image display panel configured to display an image, and a backlight unit configured to provide light to the image display panel and including an LED light source module.

The LED light-source module may include a circuit board and any one of the above-described white light emitting apparatuses.

According to an aspect of still another exemplary embodiment, a lighting apparatus may include an LED light source module, and a spread sheet disposed on the LED light source module and configured to uniformly spread light incident from the LED light source module. The LED light source module may include a circuit board and any one of the above-described white light emitting apparatuses mounted on the circuit board.

According to an aspect of still another exemplary embodiment, a backlight unit (BLU) of a display apparatus may include: a light emitting diode (LED) configured to emit light; and a fluorescent member configured to convert a wavelength of the light emitted from the LED and emit light having the converted wavelength, the fluorescent member including a red phosphor, which includes a nitride represented by a formula $(Sr_{1-x-y}Ba_xEu_y)_2Si_5N_8$, wherein, $0<x<0.7$ and $0<y<0.1$. 31.

The LED may be configured to emit blue light and the fluorescent member may be configured to convert a wavelength of the blue light to a wavelength of red light.

The fluorescent member may be disposed on a surface of a case in which the LED is accommodated.

The BLU may further include a light guide plate, wherein the fluorescent member is provided at a side of the light guide plate.

The BLU may further include a light guide plate, wherein the fluorescent member is provided on a light emitting surface of the light guide plate.

BRIEF DESCRIPTION OF DRAWINGS

The above and/or other aspects will become more apparent by describing certain exemplary embodiments with reference to the accompanying drawings in which.

DETAILED DESCRIPTION

Figure 1:
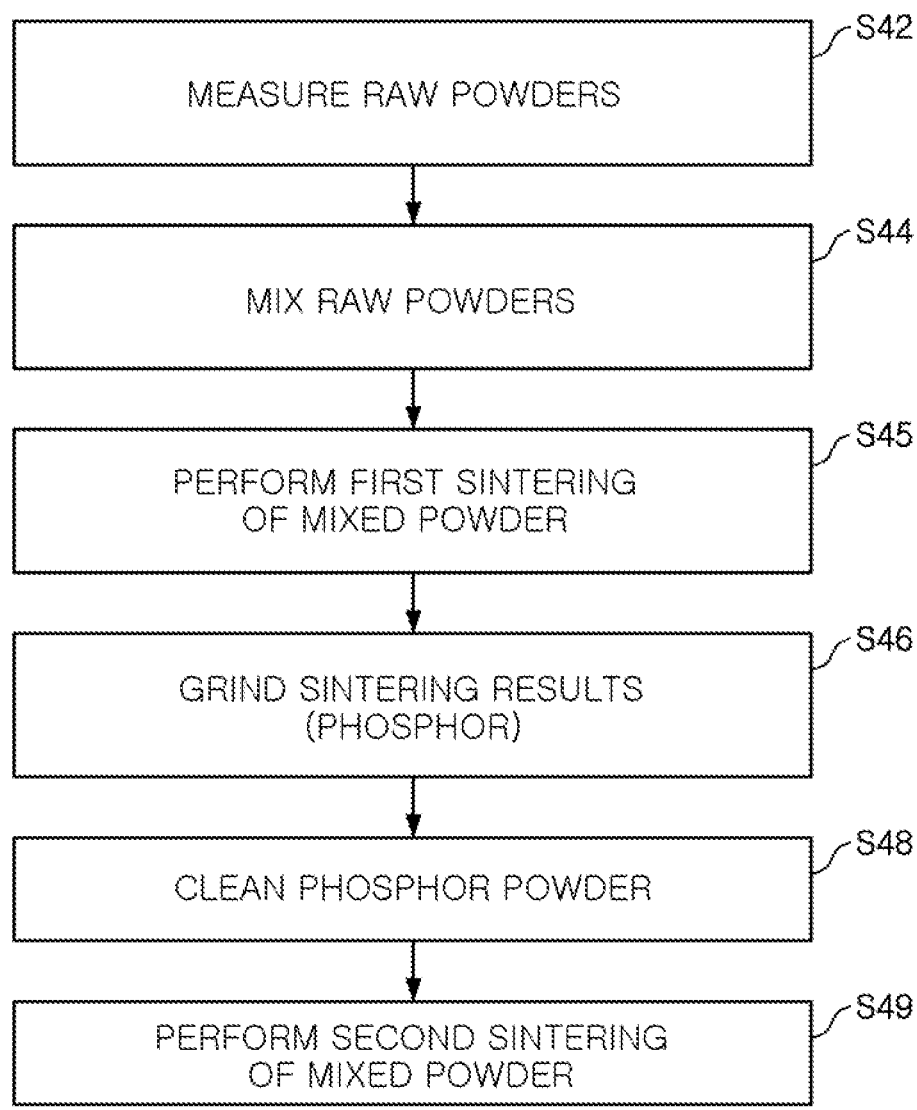
FIG. 1 is a flowchart illustrating a method of forming a red phosphor according to an exemplary embodiment.

Hereinafter, certain exemplary embodiments will be described in detail with reference to the accompanying drawings.

The inventive concept may, however, be exemplified in many different forms and should not be construed as being limited to the specific embodiments set forth herein. Rather, these exemplary embodiments are provided so that this disclosure will be thorough and complete, and will fully convey the scope of the inventive concept to those skilled in the art. In the drawings, the shapes and dimensions of elements may be exaggerated for clarity, and the same reference numerals will be used throughout to designate the same or like elements. Throughout this disclosure, directional terms such as "upper," "upper (portion)," "upper surface," "lower," "lower (portion)," "lower surface," or "side surface" may be used to describe the relationship of one element or feature to another, as illustrated in the drawings. It will be understood that such descriptions are intended to encompass different orientations in use or operation in addition to orientations depicted in the drawings.

References throughout this disclosure to "one exemplary embodiment" or "an exemplary embodiment" are provided to emphasize particular features, structures, or characteristics, and do not necessarily refer to the same embodiment. Furthermore, the particular features, structures, or characteristics may be combined in any suitable manner in one or more embodiments. For example, a context described in a specific exemplary embodiment may be used in other embodiments, even if it is not described in the other embodiments, unless it is described contrary to or in a manner inconsistent with the context in the other embodiments.

A red phosphor according to an exemplary embodiment may include a nitride represented by a compositional formula of $(Sr_{1-x-y}Ba_xEu_y)_2Si_5N_8$ ($0<x<0.7$, $0<y<0.1$).

Since the red phosphor has a peak wavelength in the range of about 600 nm to about 630 nm (e.g., 620 nm or less), which belongs to a relatively short wavelength band of a red wavelength, desired white light characteristics (e.g. a correlated color temperature (CCT) or a color rendering index (CRI)) may be implemented when it is applied to a white light-emitting apparatus. In consideration of brightness together with a relatively shorter wavelength, the red phosphor may include a nitride represented by a compositional formula of $(Sr_{1-x-y}Ba_xEu_y)_2Si_5N_8$ ($0.19<x<0.6$, $0.018<y<0.04$).

A content of oxygen as an impurity in the red phosphor may be 1 wt % or less. Although the red phosphor is a nitride phosphor, the phosphor may include oxygen as an impurity. Such oxygen may form a non-emission level within a bandgap, and excited electrons may become phonons rather than photons due to loss of energy from such a non-emission level. As a result, efficiency and reliability of the phosphor may be degraded. Thus, by controlling the content of oxygen to be less than a predetermined level (e.g., 1 wt % or less), the formation of the non-emission level may be suppressed, and thus the phosphor may have a higher level of brightness and may be reliable in a higher temperature, higher humidity package environment. The oxygen content may be controlled by suppressing the generation of an oxide during a manufacturing process, which will be described in FIG. 1 in detail below.

By controlling a particle size D50 of the red phosphor to be 10 μm≤D50≤25 μm, degradation in brightness and changes in color coordinates in the phosphor may be obtained. Thus, the phosphor may have improved reliability. While a phosphor having a smaller particle size may be uniformly spread in a resin package, degradation in brightness and changes in color coordinates may occur under the package environment. On the other hand, when the particle size D50 of the phosphor exceeds 25 μm, spreadability in the resin package may be lowered and variations in brightness and color may be increased. When a quartile deviation (Q.D.) related to a particle size is defined as (D75−D25)/(D75+D25), the quartile deviation of the red phosphor may satisfy 0.18<Q.D.<0.32. Thus, according to an exemplary embodiment, crystallinity of the red phosphor may be improved, resulting in increase in brightness. Accordingly, reliability of the red phosphor may be substantially improved.

FIG. 1 is a flowchart illustrating a method of fabricating a red phosphor according to an exemplary embodiment.

First, to fabricate a nitride phosphor represented by a compositional formula of $(Sr_{1-x-y}Ba_xEu_y)_2Si_5N_8$ (wherein, 0<x<0.7 and 0<y<0.1), raw powders including a Sr-containing nitride, a Ba-containing nitride, a Si-containing nitride, and a Eu-containing nitride may be measured (S42).

To control an oxygen concentration in the phosphor, a concentration of oxygen in the raw powders may be 1 wt % or less. For example, the raw powders may include $Sr_3N_2$, $Ba_3N_2$, EuN, and $Si_3N_4$.

Next, a mixed powder may be prepared by mixing the raw powders (S44). The mixing process of the raw powders may be performed in a closed space filled with an inert gas, such as an argon (Ar) gas. In this manner, contact with oxygen may be substantially prevented.

Next, the mixed powder may be sintered to obtain a phosphor (S45). The sintering process of the mixed powder may be performed at a temperature of 1500° C. to 1900° C. under a nitrogen gas or hydrogen/nitrogen gas atmosphere. A gas pressure sintering (GPS) furnace may be used in the sintering process. The sintering process may be performed in a state in which the mixed powder fills a metal or ceramic crucible. In particular, differently from a related art BN ceramic crucible, the metal crucible may substantially suppress the generation of impurities even when the metal crucible is exposed to a sintering process at a higher temperature. Accordingly, the metal crucible may allow the concentration of oxygen as an impurity to be maintained at 1 wt % or less (preferably, 0.5 wt % or less) in the final nitride phosphor.

Next, the sintered result may be grinded to obtain a phosphor powder having a preferred particle size (S46). In the above process, the sintered result, that is, a synthesized phosphor may be subjected to a grinding process, such as ball-milling process. Through the grinding process, particle sizes D50 of powder of the red phosphor may be controlled to be in the range of 10 μm≤D50≤25 μm. In addition, when a quartile deviation (Q.D.) related to particle size is defined as (D75−D25)/(D75+D25), the quartile deviation of the red phosphor may satisfy 0.18<Q.D.<0.32.

Next, the phosphor powder may be cleaned (S48). The cleaning process may be performed to remove impurities or fine powder from a surface of phosphor powder of which particle sizes are controlled. For example, an acid or base solution may be used in the cleaning process.

Next, the cleaned phosphor powder may be additionally (or secondarily) sintered (S49). In the second sintering process, defects of the phosphor may be removed and crystallinity of the phosphor may be improved. According to the improved crystallinity, brightness of the phosphor may be improved. The second sintering process may be performed at a temperature of about 1500° C. to about 1900° C. for about 5 to about 30 hours. A pressure may be in the range of normal pressure to 10 bars. The temperature of the second sintering process may be the same as or greater than that of the first sintering process. In addition, a sintering time for the second sintering process may be the same as or longer than that for the first sintering process.

Experiment 1: Fabrication of Red Nitride Phosphor Difference According to Content of Barium (Ba)

By using $Sr_3N_2$, $Ba_3N_2$, EuN, and $Si_3N_4$ as raw materials, Samples A1 to A6 of nitride phosphors comprising $(Sr_{1-x-y}Ba_xEu_y)_2Si_5N_8$ satisfying conditions for Ba content as shown in Table 1 were fabricated. More specifically, the raw materials were measured and prepared, and the prepared raw materials were mixed with ethanol, using a ball-milling process. The ethanol was volatilized from the mixture of the raw material by using a dryer, the mixture of the dried raw material was placed in a BN crucible, and the BN crucible filled with the mixture of the raw material was inserted into a furnace and sintered at a temperature of about 1800° C. in an Ar gaseous state. The sintered phosphor was cleaned.

Figure 2A:
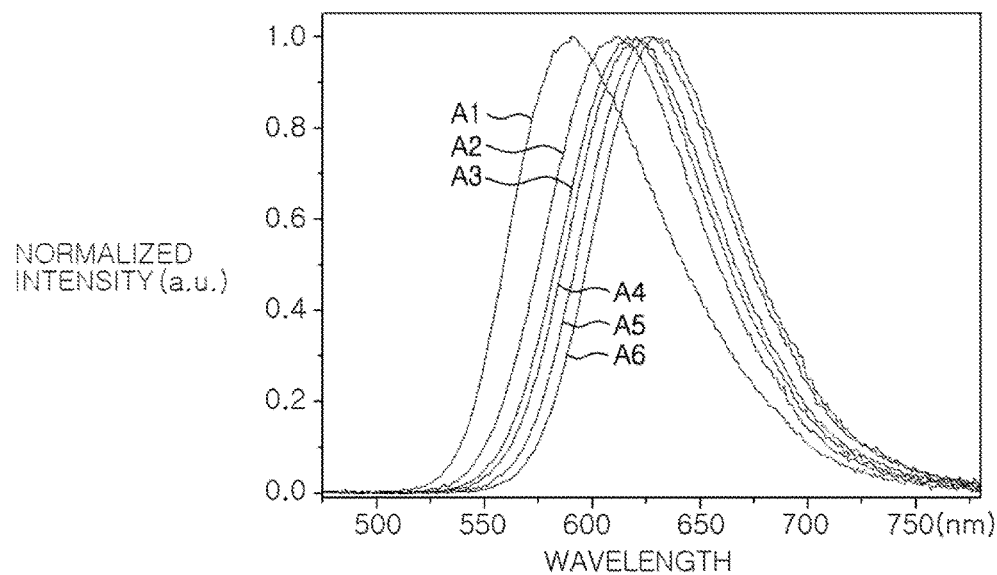
FIGS. 2A and 2B are graphs respectively illustrating peak wavelengths and relative peak intensities of red phosphors according to related art and an exemplary embodiment.
Figure 2B:
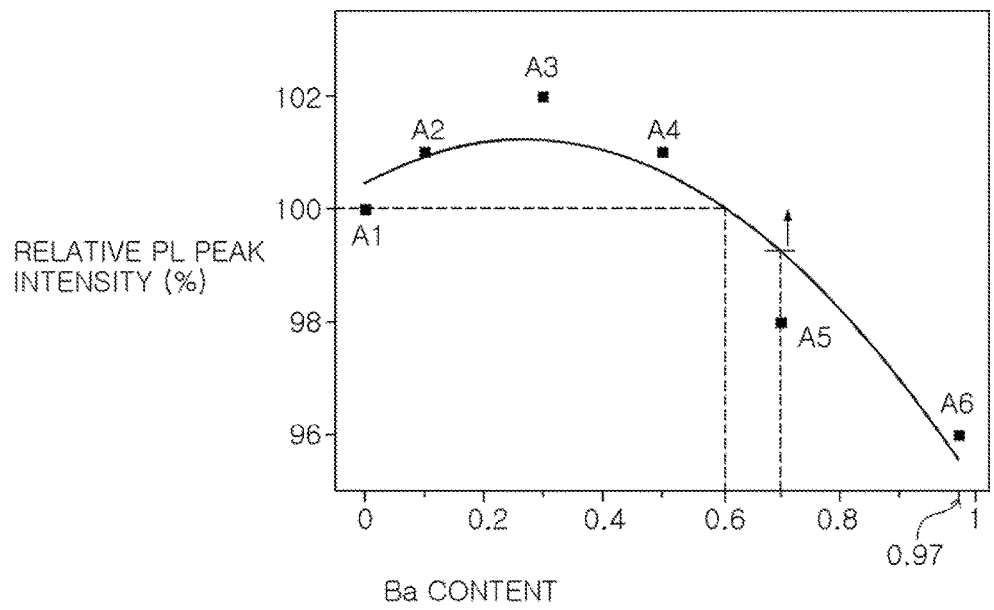

Peak wavelengths and relative peak intensities of nitride phosphors according to Sample A1 to Sample A6 were measured, and results thereof are illustrated in FIGS. 2A and 2B and Table 1.

TABLE 1

| Division | Ba Content (x) | Eu Content (y) | Sr Content (1 − x − y) | Peak Wavelength (nm) | Relative Peak Intensity (%) |
|---|---|---|---|---|---|
| Sample A1 | 0 | 0.03 | 0.97 | 590 | 100 |
| Sample A2 | 0.1 | 0.03 | 0.87 | 615 | 101 |
| Sample A3 | 0.3 | 0.03 | 0.67 | 620 | 102 |
| Sample A4 | 0.5 | 0.03 | 0.57 | 623 | 101 |
| Sample A5 | 0.7 | 0.03 | 0.27 | 626 | 98 |
| Sample A6 | 0.97 | 0.03 | 0 | 630 | 96 |

As illustrated in FIGS. 2A and 2B and Table 1, a peak wavelength of Sample A1 was less than 600 nm (refer to FIG. 2A), and relative peak intensities of Sample A5 and sample A6 were weaker than that of sample A1 (refer to FIG. 2B). Peak intensities of Sample A2 to Sample A4 were stronger than that of Sample A1, peak wavelengths of Sample A2 to Sample A4 may be in the range of 600 nm to 625 nm.

Difference According to Europium (Eu) Content

Similarly, Samples B1 to B6 of nitride phosphors comprising $(Sr_{1-x-y}Ba_xEu_y)_2Si_5N_8$ satisfying conditions for Eu content as shown in Table 2 were fabricated by using $Sr_3N_2$, $Ba_3N_2$, EuN, and $Si_3N_4$ as raw materials. Here, Sample B4 may correspond to Sample A3 in the above experiment.

Figure 3A:
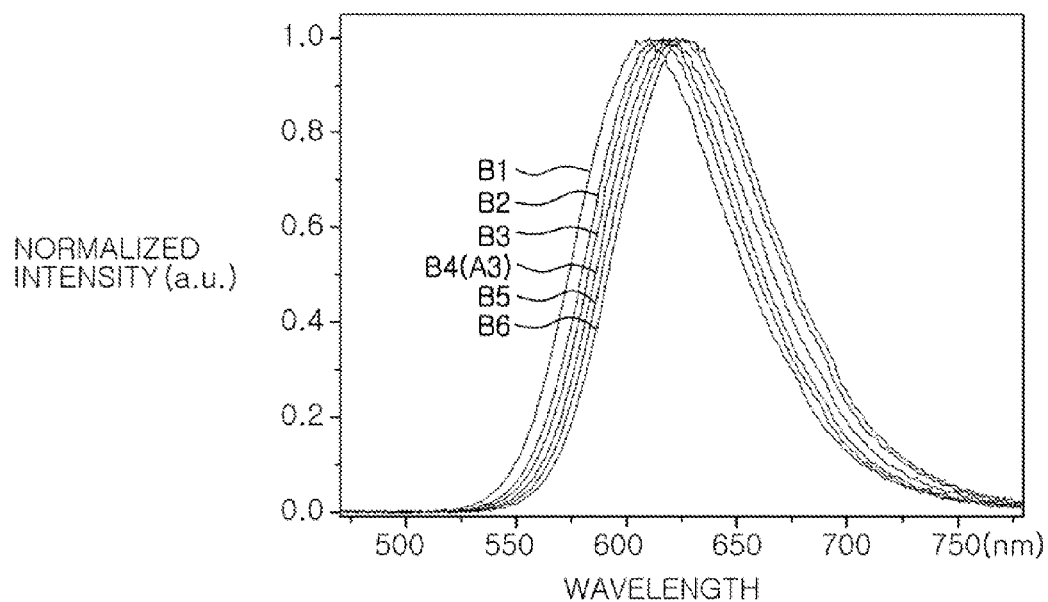
FIGS. 3A and 3B are graphs respectively illustrating peak wavelengths and relative peak intensities emitted by red phosphors according to related art and an exemplary embodiment.
Figure 3B:
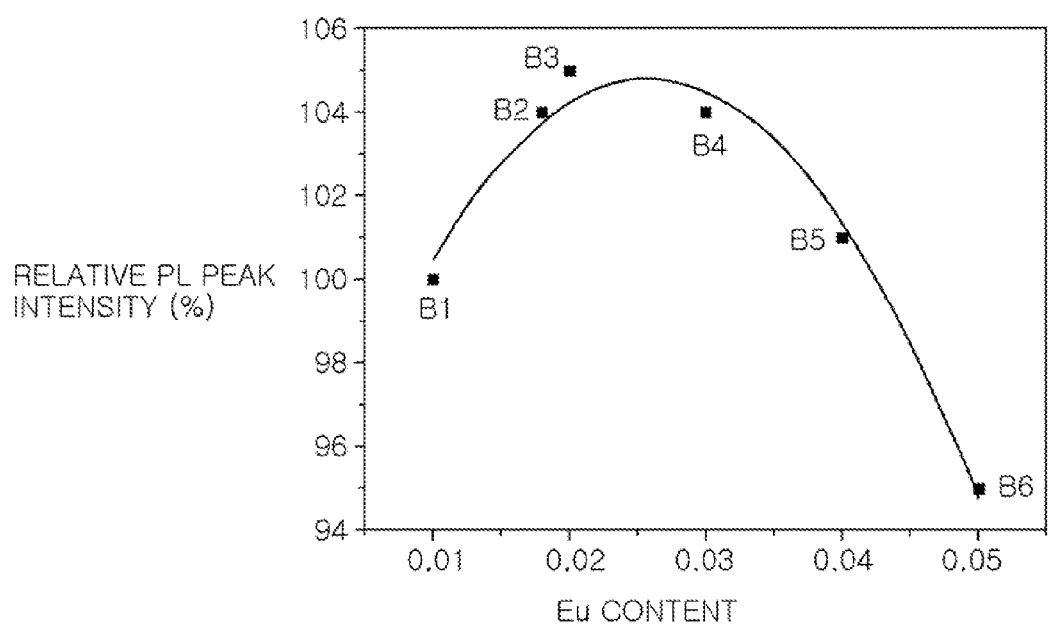

Peak wavelengths and relative peak intensities of nitride phosphors according to Sample B1 to Sample B6 were measured, and results thereof are illustrated in FIGS. 3A and 3B and Table 2.

TABLE 2

| Division | Ba Content (x) | Eu Content (y) | Sr Content (1 − x − y) | Peak Wavelength (nm) | Relative Peak Intensity (%) |
|---|---|---|---|---|---|
| Sample B1 | 0.3 | 0.01 | 0.69 | 608 | 100 |
| Sample B2 | 0.3 | 0.018 | 0.682 | 613 | 104 |
| Sample B3 | 0.3 | 0.02 | 0.68 | 615 | 105 |
| Sample B4 (A4) | 0.3 | 0.03 | 0.67 | 620 | 104 |
| Sample B5 | 0.3 | 0.04 | 0.66 | 624 | 101 |
| Sample B6 | 0.3 | 0.05 | 0.65 | 627 | 95 |

As illustrated in FIGS. 3A and 3B and Table 2, peak wavelengths of Sample B1 to Sample B6 were maintained within the range of 600 nm to 630 nm (refer to FIG. 2A), and relative peak intensities were relatively high except for Sample B6, in which y in $(Sr_{1-x-y}Ba_xEu_y)_2Si_5N_8$ is greater than 0.04. Peak intensities of Sample B2 to Sample B5 were stronger than that of Sample B1, and peak wavelengths of Sample B2 to Sample B5 may be in the range of 610 nm to 625 nm.

Experiment 2: Reduction in Oxygen Content

Oxygen and Nitrogen Contents in $(Sr_{0.67}Ba_{0.3}Eu_{0.03})_2Si_5N_8$ of Sample A3 (corresponding to Sample B4, Exemplary Embodiment 1) and in a related art nitride phosphor were analyzed, and the results thereof are shown in Table 3.

TABLE 3

| Division | Oxygen Content (wt %) | Nitrogen Content (wt %) |
|---|---|---|
| Exemplary Embodiment 1 | 0.2 | 25.84 |
| Comparative Example 1 | 1.7 | 22.2 |

As shown in Table 3, Exemplary Embodiment 1, differently from Comparative Example 1, showed a substantially reduced content of oxygen by only using the nitride as a raw powder and performing a sintering process in a state in which the nitride raw power is placed in a metal crucible. As a result, an oxygen content of a red nitride phosphor fabricated according to Exemplary Embodiment 1 was 0.2 wt %, while an oxygen content of a red nitride phosphor fabricated according to Comparative Example 1 was relatively high as 1.7 wt %.

Experiment 3: Improvement Effect in White Light-Emitting Apparatus

A white light-emitting apparatus (Exemplary Embodiment 2) was fabricated using a nitride semiconductor light-emitting device having a main wavelength of 450 nm. A nitride phosphor prepared in Exemplary Embodiment 1 and β-SiAlON were used as a red phosphor and a green phosphor, respectively.

Four white light-emitting apparatuses (Comparative Examples 2A to 2D) were fabricated under the same conditions as those of Exemplary Embodiment 2, except that red phosphors therein were different. That is, red phosphors used in Comparative Examples 2A to 2D were a $(Sr,Ca)AlSiN_3:Eu^{2+}$ phosphor that is used in a related art commercial product, and other three kinds of $(Sr, Ba, Eu)_2Si_5N_8:Eu^{2+}$ phosphor. In particular, the red phosphor used in Comparative Example 2B was the red nitride phosphor fabricated according to Comparative Example 1 whose oxygen content was analyzed in Experiment 2.

Luminous fluxes and CRIs of white light-emitting apparatuses according to Comparative Examples 2A to 2D together with Exemplary Embodiment 2 were measured. The results thereof are shown in Table 4. The relative luminous flux may be evaluated on the basis of the luminous flux of Comparative Example 2A.

TABLE 4

| Division | Relative Luminous Flux (1 m %) | CRI |
|---|---|---|
| Exemplary Embodiment 2 | 102.5 | 82 |
| Comparative Example 2A | 100 | 83 |
| Comparative Example 2B | 96.4 | 81 |
| Comparative Example 2C | 98.5 | 82 |
| Comparative Example 2D | 97.7 | 81 |

As shown in Table 4, CRI were at similar levels (81 to 83) in all of the samples. However, a white light-emitting apparatus according to Exemplary Embodiment 2 had the highest luminous flux, which was improved by about 2.5% compared to a luminous flux of a white light-emitting apparatus according to Comparative Example 2A and by about 5% or more compared to Comparative Example 2B to Comparative Example 2D.

Figure 4:
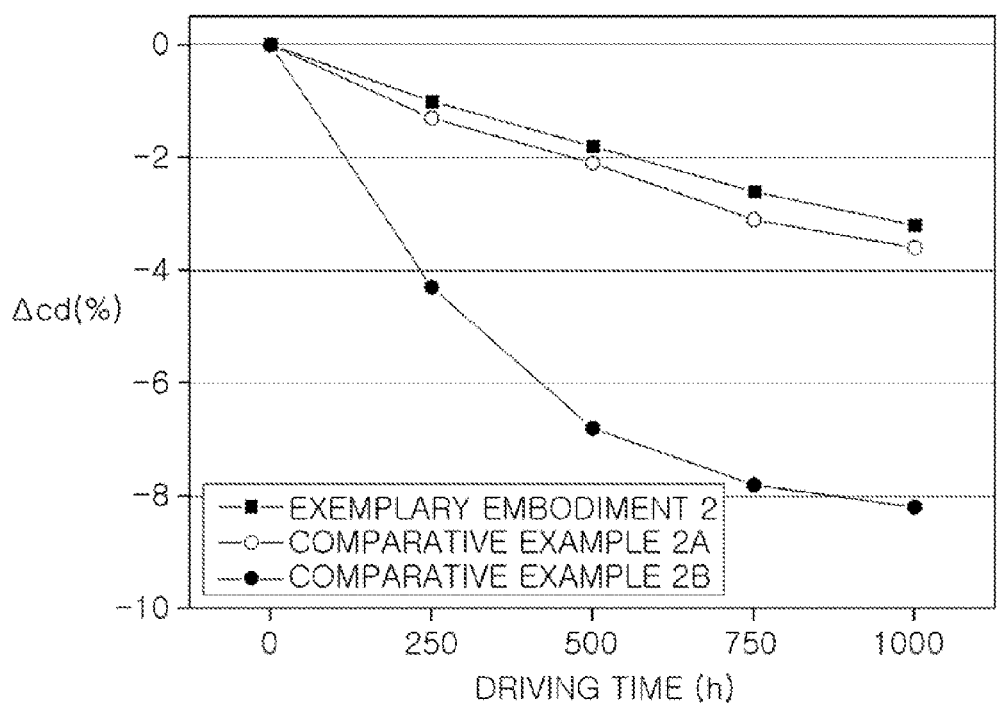
FIG. 4 is a graph illustrating comparative results of evaluation on package reliability of red phosphors according to exemplary embodiments.

Reliability of white light-emitting apparatuses according to Exemplary Embodiment 2 and Comparative Example 2A to 2B were evaluated. More specifically, while each white light-emitting apparatus was driven at 120 mA and exposed to a higher temperature, higher humidity environment (85° C. and 85%), variations in brightness (Δcd), and variations in color coordinates x (ΔCx) were measured by time. The results thereof are shown in Table 5 and Table 6. The variations in brightness are illustrated in FIG. 4.

TABLE 5

| Time | 0 | 250 | 500 | 1000 | 1500 | 2000 |
|---|---|---|---|---|---|---|
| Exemplary Embodiment 2 | 0.0% | −1.0% | −1.8% | −3.2% | −6.2% | −9.4% |
| Comparative Example 2A | 0.0% | −1.3% | −2.1% | −3.6% | −7.8% | −11.6% |
| Comparative Example 2B | 0.0% | −4.3% | −6.8% | −8.2% | −12.5% | −14.3% |

As shown in Table 5, the variations in brightness (Δcd) of the white light-emitting apparatus according to Exemplary Embodiment 2 were only −6.2% and −9.4% even when 1500 hours and 2000 hours had elapsed, whereas the variations in brightness (Δcd) of the white light-emitting apparatus according to Comparative Example 2B, in a similar composition group to the white light-emitting apparatus according to Exemplary Embodiment 2, were high, that is, greater than −10% when 1500 hours and 2000 hours had elapsed.

TABLE 6

| Time | 0 | 250 | 500 | 1000 | 1500 | 2000 |
|---|---|---|---|---|---|---|
| Exemplary Embodiment 2 | 0 | −0.0001 | −0.0001 | −0.002 | −0.005 | −0.011 |
| Comparative Example 2A | 0 | −0.0001 | −0.0002 | −0.003 | −0.006 | −0.014 |
| Comparative Example 2B | 0 | −0.0003 | −0.004 | −0.007 | −0.013 | −0.016 |

As shown in Table 6, the variations in color coordinates x (ΔCx) of the white light-emitting apparatus according to Exemplary Embodiment 2 were only −0.002% and −0.005% even when 1000 hours and 1500 hours had elapsed, whereas the variations in color coordinates x (ΔCx) of the white light-emitting apparatus according to Comparative Example 2B, in a similar composition group to the white light-emitting apparatus according to Exemplary Embodiment 2, were more than doubled.

Thus, it can be seen that the white light-emitting apparatus according to Exemplary Embodiment 2 maintained a higher level of reliability even in the higher temperature, higher humidity environment. This may be because the red phosphor included in the white light-emitting apparatus according to Exemplary Embodiment 2 has a lower content of oxygen than the related art red phosphor included in the white light-emitting apparatus according to Comparative Example 2B, as listed in Table 3.

Experiment 4: Effect of Reduction in Particle Size

Nitride phosphors comprising $(Sr_{0.67}Ba_{0.3}Eu_{0.03})_2Si_5N_8$ were fabricated under the same conditions as those of Exemplary Embodiment 1, except that particle sizes are different. Specifically, red phosphors having particle sizes of 20.2 μm and 5.3 μm, respectively, on the basis of mass median particle size D50 were prepared by grinding, and white light-emitting apparatuses (Exemplary Embodiments 3A and 3B) were fabricated in the same conditions as those of Exemplary Embodiment 2, except that red phosphors thereof are different.

Figure 5:
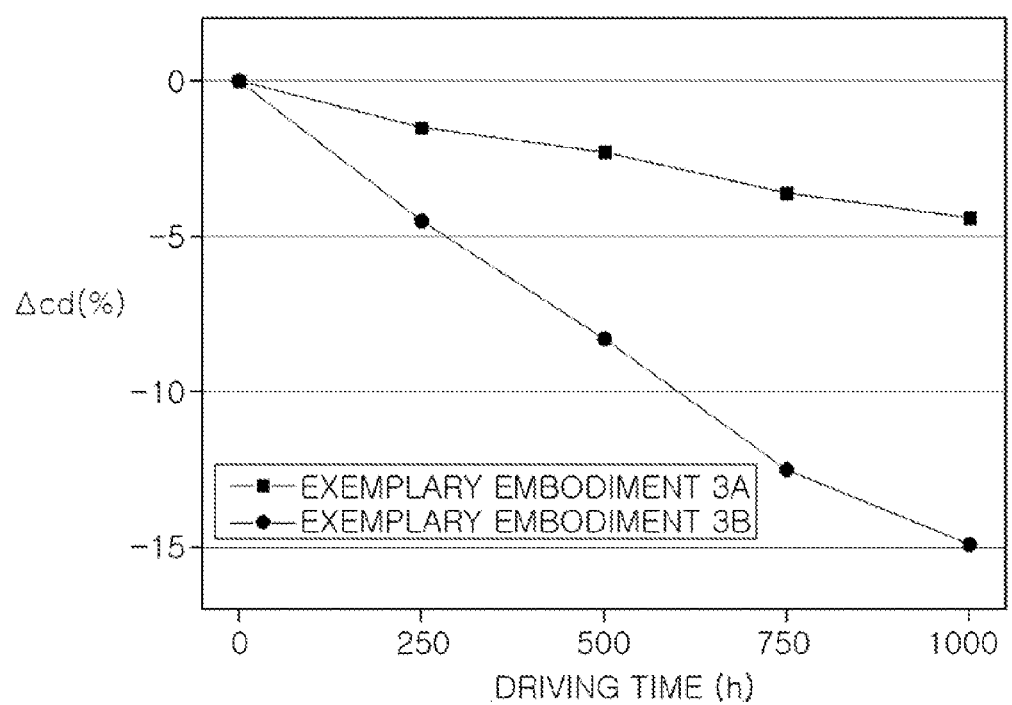
FIG. 5 is a graph illustrating results of evaluation on package reliability of red phosphors according to exemplary embodiments.

Reliabilities of the white light-emitting apparatuses according to Exemplary Embodiment 3A (having a particle size of 20.2 μm) and Exemplary Embodiment 3B (having a particle size of 5.3 μm) were evaluated. The reliability evaluation was carried out in two aspects. First, after each white light-emitting apparatus was driven at a temperature of 105° C. for 1000 hours, variations in brightness (Δcd) and variations in color coordinates x and y (ΔCx and ΔCy) were measured. The results thereof are shown in FIG. 5 and Table 7. In addition, after each white light-emitting apparatus was driven at a temperature of 85° C. in a relative humidity of 85% for 1000 hours, variations in brightness (Δcd) and variations in color coordinates x and y (ΔCx and ΔCy) were measured. The results thereof are shown in Table 8.

TABLE 7

| Division | Variation in Brightness (Δcd) | Variation in Color Coordinate x (ΔCx) | Variation in Color Coordinate y (ΔCy) |
|---|---|---|---|
| Exemplary Embodiment 3A | +0.4% | 0 | 0.001 |
| Exemplary Embodiment 3B | −0.5% | −0.001 | 0 |

As shown in Table 7, there was no substantial variations in the color coordinates in Exemplary Embodiment 3A (having a particle size of 20.2 μm), similar to Exemplary Embodiment 3B (having a particle size of 5.3 μm). However, the brightness was reduced by 0.5% in the white light-emitting apparatus according to Exemplary Embodiment 3B, but not reduced in the white light-emitting apparatus according to Exemplary Embodiment 3A.

TABLE 8

| Division | Variation in Brightness (Δcd) | Variation in Color Coordinate x (ΔCx) | Variation in Color Coordinate y (ΔCy) |
|---|---|---|---|
| Exemplary Embodiment 3A | −4.4% | −0.003 | −0.003 |
| Exemplary Embodiment 3B | −14.9% | −0.012 | −0.018 |

As shown in Table 8, unlike the results shown in Table 7, the variations in the color coordinates as well as the variation in the brightness were substantially improved (i.e., reduced) in the white light-emitting apparatus having the particle size of 20.2 μm according to Exemplary Embodiment 3A, compared to the white light-emitting apparatus having the particle size of 5.3 μm according to Exemplary Embodiment 3B.

Thus, reliability may be substantially different according to particle sizes. Accordingly, in consideration of this, the particle size (D50) of the phosphor according to an exemplary embodiment may be in the range of 10 μm to 25 μm.

The red nitride phosphor according to an exemplary embodiment may be advantageously used in various types of white light-emitting apparatus.

Figure 6A:
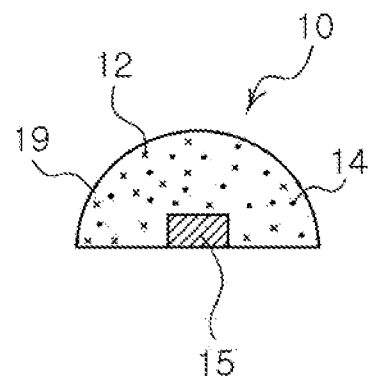
FIGS. 6A to 6C are schematic diagram illustrating white light-emitting apparatuses according to various exemplary embodiments.
Figure 6B:
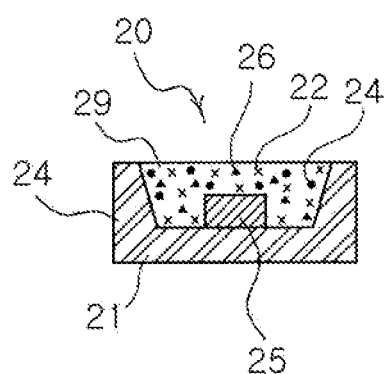
Figure 6C:
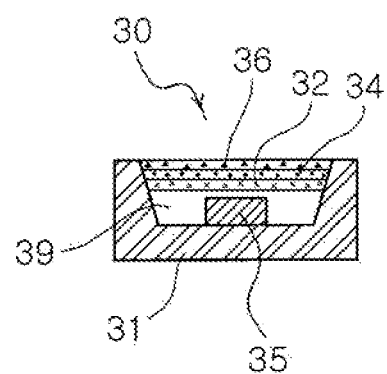

FIGS. 6A to 6C are schematic diagrams illustrating white light-emitting apparatuses according to various exemplary embodiments.

FIG. 6A is a schematic diagram illustrating a white light-emitting apparatus according to an exemplary embodiment.

As illustrated in FIG. 6A, a white light-emitting apparatus package 10 according to the exemplary embodiment may include a blue semiconductor light-emitting device 15 and a resin package 19 configured to package the blue semiconductor light-emitting device 15 and having an upwardly convex lens shape.

In the exemplary embodiment, the resin package 19 may have a hemispherical lens structure to have a wider orientation angle. The blue semiconductor light-emitting device 15 may be directly mounted on a separate circuit board. The resin package 19 may include a silicon resin, an epoxy resin, or a combination thereof. A green phosphor 14 and a red phosphor 12 are distributed in the resin package 19.

The red phosphor 12 may include the red phosphor according to the above-described exemplary embodiments. That is, the red phosphor 12 may include the nitride phosphor represented by the compositional formula of $(Sr_{1-x-y}Ba_xEu_y)_2Si_5N_8$, wherein 0<x<0.7, and 0<y<0.1.

The red phosphor 12 may further include another red phosphor. For example, the another red phosphor may be at least one selected from a nitride-based phosphor represented by $MlAlSiN_x$:Re (1≤x≤5), a sulfide-based phosphor represented by MlD:Re, and a silicate-based phosphor represented by $(Sr,L)_2SiO_{4-x}N_y$:Eu (0<x<4 and y=2x/3). Here, Mich. is at least one selected from Ba, Sr, Ca, and Mg, D is at least one selected from S, Se, and Te, L is at least one selected from Ba, Sr, Ca, Mg, Li, Na, K, Rb, and Cs, and Re is at least one selected from Y, La, Ce, Nd, Pm, Sm, Gd, Tb, Dy, Ho, Er, Tm, Yb, Lu, F, Cl, Br, and I.

The green phosphor 14 may include at least one from among an oxide-based phosphor represented by a compositional formula of $M_3Al_5O_{12}$, oxynitride-based phosphor, β-sialon phosphor represented by a compositional formula of $Si_{6-z}Al_zO_zN_{8-z}$, and $La_3Si_6N_{11}$:Ce phosphor. Here, M is at least one selected from the group consisting of Y, Lu, Gd, Ga, Be, Mg, Ca, Sr, Ba, and Zn. As the oxynitride-based phosphor, an oxynitride phosphor represented by a compositional formula of $Ml_xA_yO_xN_{(4/3)y}$ or $Ml_aA_bO_c N_{(2/3)a+(4/3)b-(2/3)c}$ may be used. Here, Mich. is at least one selected from the group consisting of Ba, Sr, Ca, and Mg, and A is at least one selected from the group consisting of C, Si, Ge, Sn, Ti, Zr, and Hf.

Thus, white light having a higher CRI (e.g. 70 or more) may be provided by combining the red phosphor 12 and the green phosphor 14 together with the blue semiconductor light-emitting device 15. In addition, since light having various wavelength bands is obtained through the plurality of phosphors, display devices having improved color reproducibility may be implemented.

A dominant wavelength of the blue semiconductor light-emitting device 15 may be in the range of 420 nm to 470 nm. The red phosphor 12 according to an exemplary embodiment may have a peak wavelength in a short wavelength band (600 nm to 630 nm) of the red band. For example, the red phosphor 12 may have a peak wavelength in the range of 600 nm to 620 nm. A peak wavelength of the green phosphor 14 may be in the range of 500 nm to 550 nm.

The blue semiconductor light-emitting device 15 may have a half width of 10 nm to 50 nm, the red phosphor 12 may have a half width of 50 nm to 180 nm, and the green phosphor 14 may have a half width of 30 nm to 200 nm.

Since the red phosphor 12 included in an exemplary embodiment may have a higher level of reliability in a higher temperature, higher humidity environment as well as a higher level of brightness as described above in the exemplary embodiments, a higher level of brightness and excellent white light in a package environment may be secured, compared to a related art red phosphor.

In some embodiments, a yellow phosphor or yellowish orange phosphor may be additionally included to the above-described red phosphor 12 and green phosphor 14, as shown in FIG. 6B. In this case, a more improved CRI may be secured.

A white light-emitting apparatus package 20 illustrated in FIG. 6B may include a package body 21 including a reflective cup in a center portion thereof, a blue semiconductor light-emitting device 25 mounted on a bottom of the reflective cup, and a resin package 29 encapsulating the blue semiconductor light-emitting device 25.

In an exemplary embodiment, the resin package 29 may include a red phosphor 22 and a green phosphor 24, and additionally include a third phosphor including, for example, yellow or yellowish orange phosphor 26. The red phosphor 22 may include a nitride phosphor described in the exemplary embodiments, and the green phosphor 24 may include the green phosphor 14 described with reference to FIG. 6A.

As the yellow phosphor, a silicate-based phosphor, a garnet-based phosphor, such as YAG or TAG, or a nitride-based phosphor may be used. As the orange-yellow yellowish orange phosphor, α-SiAlON:Re phosphor may be used.

In exemplary embodiments illustrated in FIGS. 6A and 6B, two or more kinds of phosphors are distributed within a single resin package, but are not limited thereto. For example, two or three kinds of phosphors may be provided to be disposed in different layers among multiple layers, as illustrated in FIG. 6C.

A white light-emitting apparatus package 30 illustrated in FIG. 6C, similar to the exemplary embodiment illustrated in FIG. 6B, may include a package body 31 including a reflective cup in a center portion thereof, a blue semiconductor light-emitting device 35 mounted on a bottom of the reflective cup, and a resin package 39 encapsulating the blue semiconductor light-emitting device 35.

Resin layers respectively including different phosphors 32, 34, and 36 may be disposed on the resin package 39. The resin layers may include a first resin layer containing the green phosphor 34, a second resin layer containing the yellow or yellowish orange phosphor 36, and a third resin layer containing the red phosphor 32. The phosphors 32, 34, and 36 may be the same as or similar to the phosphors described with reference to FIGS. 6A and 6B.

Thus, an excellent white light-emitting apparatus may be implemented by using the above-described red phosphor. In particular, the red phosphor 32 according to an exemplary embodiment may ensure a relatively low degree of degradation in brightness and CRI even in a higher temperature or higher humidity environment. Accordingly, problems, such as degradations in brightness or decreases in service lifetime, due to the decrease in conversion efficiency, may be alleviated. Further, since shift of color coordinates is reduced, variations in the CCT may be reduced and excellent CRI characteristics may be maintained in lighting apparatus, and degradation in efficiency due to reductions in color reproducibility and decrease in a matching rate with color filters may be prevented in display apparatuses, such as backlight units (BLUs).

Figure 7:
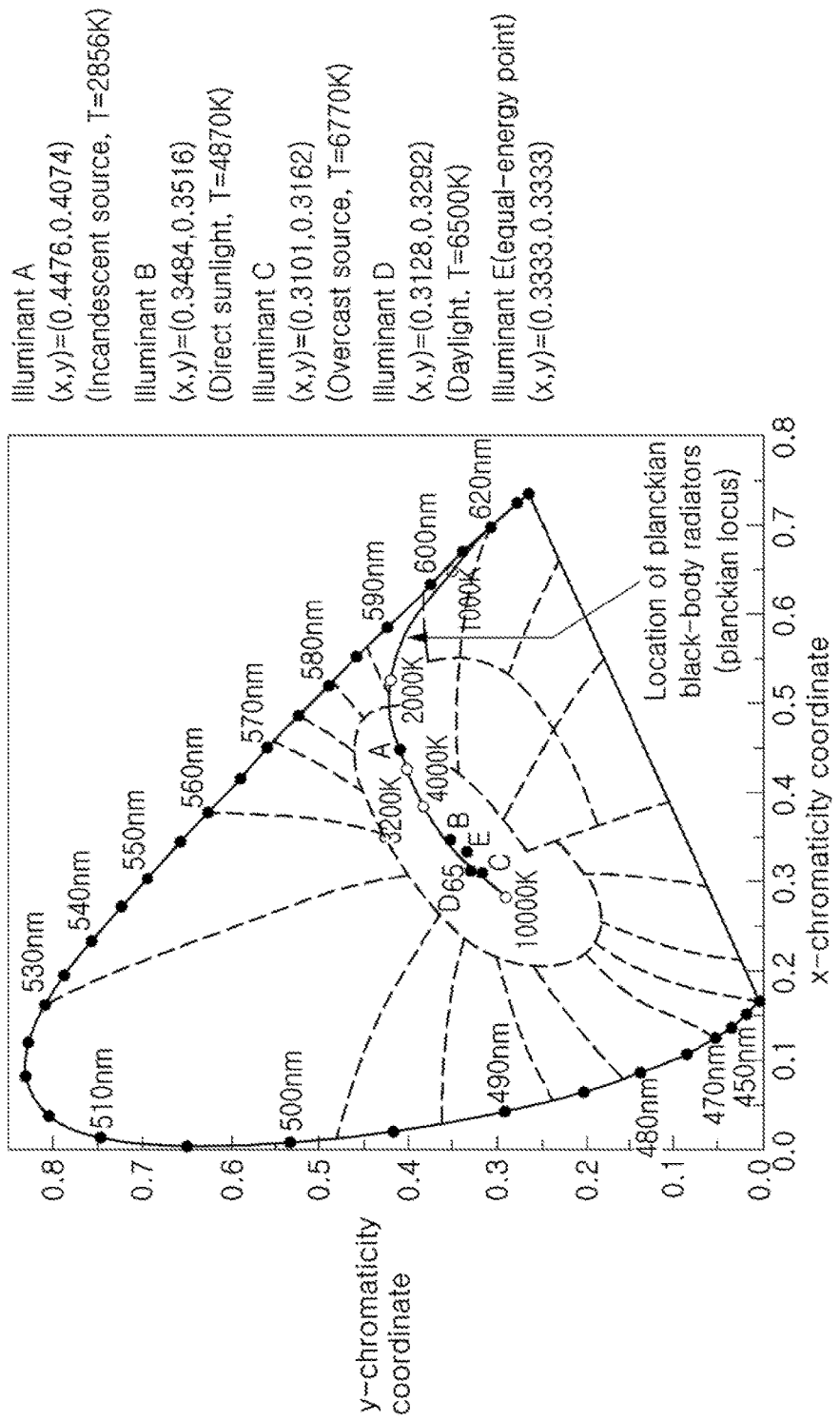
FIG. 7 is a CIE 1931 coordinate system illustrating a wavelength conversion material usable in a white light-emitting apparatus according to an exemplary embodiment.

FIG. 7 is a CIE 1931 coordinate system provided to illustrate a wavelength conversion material usable in a white light-emitting apparatus according to an exemplary embodiment.

When the light-emitting devices 15, 25, and 35 emit blue light, the light-emitting device packages 10, 20, and 30 including at least one of yellow, green, and red phosphors may emit white light having various color temperatures by controlling a compounding ratio of the phosphors. For example, a color temperature and a CRI of the white light may be controlled by adding the green phosphor and/or red phosphor in combination with the yellow phosphor.

Referring to the CIE 1931 coordinate system illustrated in FIG. 7, white light formed by a combination of a ultraviolet (UV) or blue light-emitting device, and yellow, green, and red phosphors and/or green and red light-emitting devices may have two or more peak wavelengths, and may be located on the line connecting (x, y) coordinates (0.4476, 0.4074) of a point A, (0.3484, 0.3516) of a point B, (0.3101, 0.3162) of a point C, (0.3128, 0.3292) of a point D, and (0.3333, 0.3333) of a point E in the CIE 1931 coordinate system illustrated in FIG. 7. Or, the white light may be located in a zone surrounded by the line connecting points A-D and a black body radiation spectrum. The color temperature of the white light may correspond to 2000K to 20000K.

As the red phosphor in the white light-emitting apparatus according to an exemplary embodiment, a nitride phosphor represented by a compositional formula of $(Sr_{1-x-y}Ba_xEu_y)_2 Si_5N_8$ (0<x<0.7, 0<y<0.1) may be primarily used, and another red phosphor or yellow and green phosphors may be selectively and additionally used. Examples of the another red phosphor or a yellow and green phosphors may be as follows.

*Oxide group: yellow and green $Y_3Al_5O_{12}$:Ce, $Tb_3Al_5O_{12}$:Ce, $Lu_3Al_5O_{12}$:Ce

*Silicate group: yellow and green $(Ba,Sr)_2SiO_4:Eu$, yellow and orange $(Ba,Sr)_3SiO_5:Ce$, $Ca_{1.2}Eu_{0.8}SiO_4$ corresponding to red $Ca_2SiO_4:Eu$

*Nitride group: green $\beta$-SiAlON:Eu, yellow $La_3Si_6N_{11}$:Ce, orange $\alpha$-SiAlON:Eu, red $CaAlSiN^3$:Eu, $Sr_2Si_5N_8$:Eu, $SrSiAl_4N_7$:Eu, $SrLiAl_3N_4$:Eu, $Ln_{4-x}(Eu_zM_{1-z})_xSi_{12-y}Al_yO_{3+x+y}N_{18-x-y}$ ($0.5 \le x \le 3$, $0 < z < 0.3$, and $0 < y \le 4$) (Here, Ln is at least one element selected from the group consisting of a group Ma element and a rare earth element, and M is at least one element selected from the group consisting of Ca, Ba, Sr, and Mg.)

*Fluoride group: KSF-based red $K_2SiF_6:Mn^{4+}$, $K_2TiF_6:Mn^{4+}$, $NaYF_4:Mn^{4+}$, $NaGdF_4:Mn^{4+}$ The composition of the above-described phosphor may be basically stoichiometric and each element may be substituted by another element within a corresponding group on the periodic table. For example, Sr may be substituted by Ba, Ca, or Mg in the alkaline-earth (II) group, and Y may be substituted by Tb, Lu, Sc, or Gd in the lanthanide group. In addition, an activator, Eu, may be substituted by Ce, Tb, Pr, Er, or Yb depending on a desired energy level. The activator may be used alone, or a co-activator may be additionally used to change characteristics thereof.

In addition, the phosphor may be replaced by another wavelength conversion material, such as a quantum dot. The quantum dot may be used alone or mixed with the phosphor. The quantum dot may have a structure consisting of a core such as CdSe or InP (3 to 10 nm), a shell such as ZnS or ZnSe (0.5 to 2 nm), and a ligand for stabilizing the core and the shell. In addition, the quantum dot may implement a variety of colors according to a size thereof.

Table 9 illustrates various types of phosphors of a white light-emitting apparatus package using a UV light-emitting device (200 nm to 440 nm) or a blue light-emitting device (440 nm to 480 nm), listed according to respective applications.

TABLE 9

| Purpose | Phosphor |
| --- | --- |
| LED TV BLU | $\beta$-SiAlON:$EU^{2+}$, (Ca, Sr)AlSiN$_3$:Eu$^{2+}$, La$_3$Si$_6$N$_{11}$:Ce$^{3+}$, K$_2$SiF$_6$:Mn$^{4+}$, SrLiAl$_3$N$_4$:Eu, Ln$_{4-x}$(Eu$_z$M$_{1-z}$)$_x$Si$_{12-y}$Al$_y$O$_{3+x+y}$N$_{18-x-y}$ ($0.5 \le x \le 3$, $0 < z < 0.3$, and $0 < y \le 4$), K$_2$TiF$_6$:Mn$^{4+}$, NaYF$_4$:Mn$^{4+}$, NaGdF$_4$:Mn$^{4+}$, Ca2SiO4:Eu$^{2+}$, Ca1.2Eu0.8SiO4 |
| Lightings | Lu$_3$Al$_5$O$_{12}$:Ce$^{3+}$, Ca-$\alpha$-SiAlON:Eu$^{2+}$, La$_3$Si$_6$N$_{11}$: Ce$^{3+}$, (Ca, Sr)AlSiN$_3$:Eu$^{2+}$, Y$_3$Al$_5$O$_{12}$:Ce$^{3+}$, K$_2$SiF$_6$:Mn$^{4+}$, SrLiAl$_3$N$_4$:Eu, Ln$_{4-x}$(Eu$_z$M$_{1-z}$)$_x$Si$_{12-y}$Al$_y$O$_{3+x+y}$N$_{18-x-y}$($0.5 \le x \le 3$, $0 < z < 0.3$, and $0 < y \le 4$), K$_2$TiF$_6$:Mn$^{4+}$, NaYF$_4$:Mn$^{4+}$, NaGdF$_4$:Mn$^{4+}$, Ca2SiO4:Eu$^{2+}$, Ca1.2Eu0.8SiO4 |
| Side View (Mobile, tablet PC) | Lu$_3$Al$_5$O$_{12}$:Ce$^{3+}$, Ca-$\alpha$-SiAlON:Eu$^{2+}$, La$_3$Si$_6$N$_{11}$:Ce$^{3+}$, (Ca, Sr)AlSiN$_3$:Eu$^{2+}$, Y$_3$Al$_5$O$_{12}$:Ce$^{3+}$, (Sr, Ba, Ca, Mg)$_2$SiO$_4$:Eu$^{2+}$, K$_2$SiF$_6$:Mn$^{4+}$, SrLiAl$_3$N$_4$:Eu, Ln$_{4-x}$(Eu$_z$M$_{1-z}$)$_x$Si$_{12-y}$Al$_y$O$_{3+x+y}$N$_{18-x-y}$($0.5 \le x \le 3$, $0 < z < 0.3$, and $0 < y \le 4$), K$_2$TiF$_6$:Mn$^{4+}$, NaYF$_4$:Mn$^{4+}$, NaGdF$_4$:Mn$^{4+}$, Ca2SiO4:Eu$^{2+}$, Ca1.2Eu0.8SiO4 |
| Electronics (Head Lamp, etc.) | Lu$_3$Al$_5$O$_{12}$:Ce$^{3+}$, Ca-$\alpha$-SiAlON:Eu$^{2+}$, La$_3$Si$_6$N$_{11}$:Ce$^{3+}$, (Ca, Sr)AlSiN$_3$:Eu$^{2+}$, Y$_3$Al$_5$O$_{12}$:Ce$^{3+}$, K$_2$SiF$_6$:Mn$^{4+}$, SrLiAl$_3$N$_4$:Eu, Ln$_{4-x}$(Eu$_z$M$_{1-z}$)$_x$Si$_{12-y}$Al$_y$O$_{3+x+y}$N$_{18-x-y}$ ($0.5 \le x \le 3$, $0 < z < 0.3$, and $0 < y \le 4$), K$_2$TiF$_6$:Mn$^{4+}$, NaYF$_4$:Mn$^{4+}$, NaGdF$_4$:Mn$^{4+}$, Ca2SiO4:Eu$^{2+}$, Ca1.2Eu0.8SiO4 |

As needed, a purple, blue, green, red, or orange color may be selectively mixed with a white light-emitting apparatus package to implement a color temperature according to the surrounding atmosphere. For example, a white light-emitting apparatus package having a color temperature of 4000K, a white light-emitting apparatus package having a color temperature of 3000K, and a red light-emitting device package may be disposed within a single module, but independently driven to control respective outputs therefrom. Accordingly, a color temperature of the module may be controlled to be within the range of 2000K to 4000K. In addition, a white light-emitting package module having a CRI Ra of 85 to 99 may be fabricated.

In other embodiments, a white light-emitting apparatus package having a color temperature of 5000K and a white light-emitting apparatus package having a color temperature of 2700K may be disposed within a single module but independently driven to control respective outputs therefrom. Accordingly, a color temperature of the white light-emitting module may be controlled to be within the range of 2700K to 5000K. In addition, a white light-emitting module having a CRI Ra of 85 to 99 may be fabricated.

The number of the light-emitting device packages may differ according to basic color temperature settings. When the basic color temperature settings are around 4000K, the number of light-emitting device packages corresponding to a color temperature of 4000K may be more than the number of light-emitting device packages or the number of red light-emitting device packages corresponding to a color temperature of 3000K.

Figure 16:
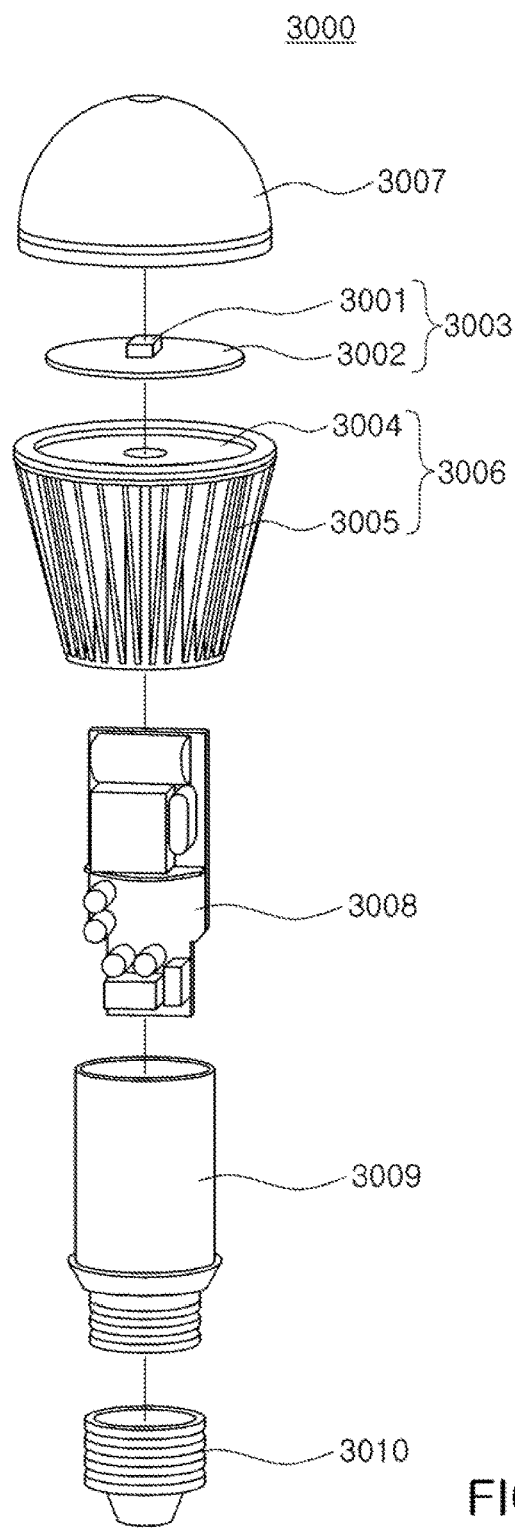
FIG. 16 is an exploded perspective view illustrating a bulb-type lighting apparatus according to an exemplary embodiment.

A module capable of controlling the CRI and color temperature may be advantageous in a lighting apparatus, which will be illustrated in FIG. 16, and the semiconductor light-emitting device according to the above-described exemplary embodiments and the package (or the module) including the same may be advantageously utilized in various applications.

For example, a light source module utilized in a light source apparatus, such as an LCD backlight unit or a lighting apparatus, may be provided.

Figure 8A:
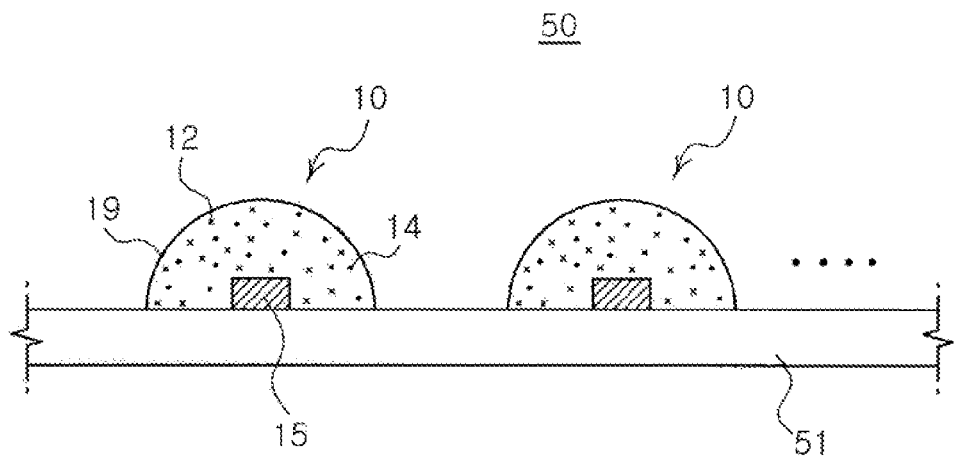
FIGS. 8A and 8B are cross-sectional views schematically illustrating a light emitting diode (LED) light source module according to various exemplary embodiments.
Figure 8B:
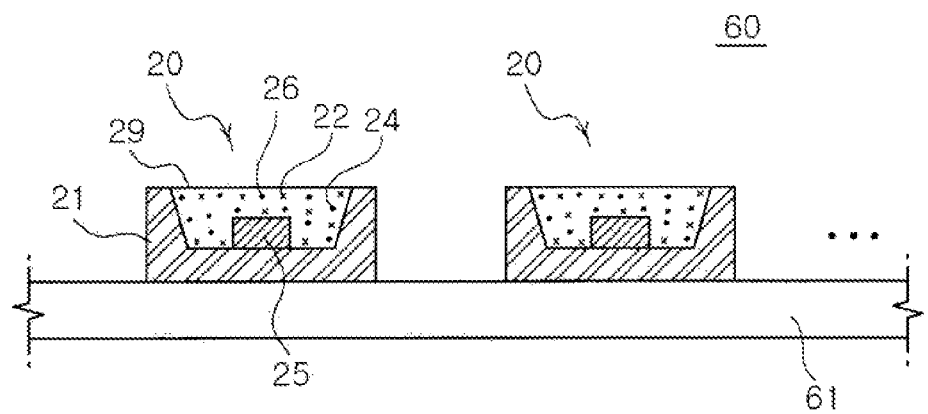

FIGS. 8A and 8B white light source modules according to exemplary embodiments.

Referring to FIG. 8A, a white light source module 50 may include a circuit board 51 and a plurality of white light-emitting apparatuses 10 mounted on the circuit board 51. The plurality of white light-emitting apparatuses 10 may include the white light-emitting apparatus illustrated in FIG. 6A. Thus, the repetitive description of the same or similar elements will be omitted.

In an exemplary embodiment, the blue semiconductor light-emitting device 15 may be directly mounted on the circuit board 51 using a chip on board method. The blue semiconductor light-emitting device 15 may be connected to a circuit line disposed on an upper surface of the circuit board 51.

Referring to FIG. 8B, a white light source module 60 may include a circuit board 61 and a plurality of white light-emitting apparatuses 20 mounted on the circuit board 61. The white light-emitting apparatus package 20 may include the blue semiconductor light-emitting device 25 mounted in the reflective cup in the package body 21, and the resin package 29 encapsulating the blue semiconductor light-emitting device 25, as illustrated in FIG. 6B. In the resin package 29, the yellow or yellowish orange phosphor 26 together with the red and green phosphors 22 and 24 may be distributed. Unlike the exemplary embodiment illustrated in FIG. 8A, the semiconductor light-emitting device 25 may be electrically connected to a circuit line of the circuit board 61 through the package body 21.

Various forms of semiconductor light-emitting devices may be applied in the white light-emitting apparatus according to the exemplary embodiments.

Figure 9A:
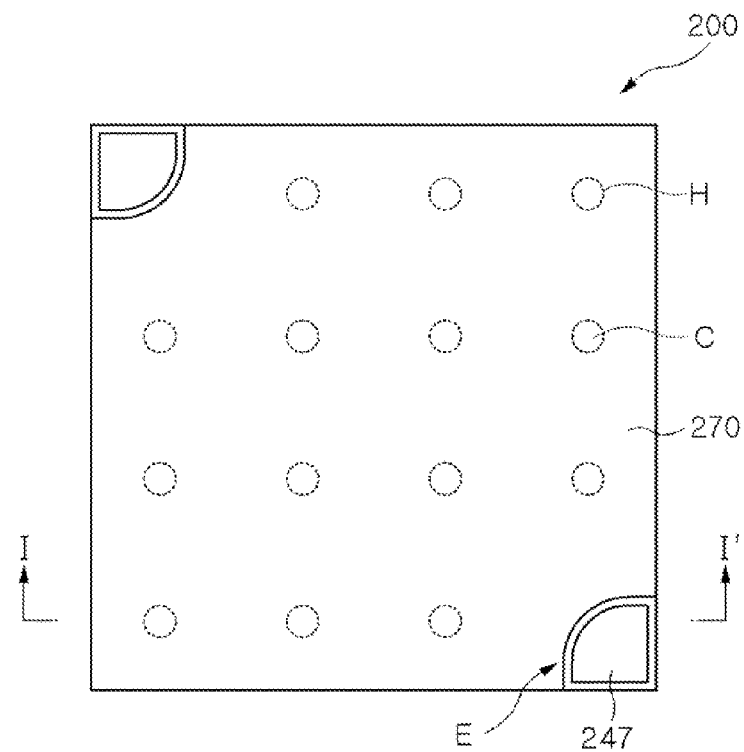
FIGS. 9A and 9B are respectively a plan view and a cross-sectional view illustrating a semiconductor light-emitting device applicable to a white light emitting apparatus according to an exemplary embodiment.
Figure 9B:
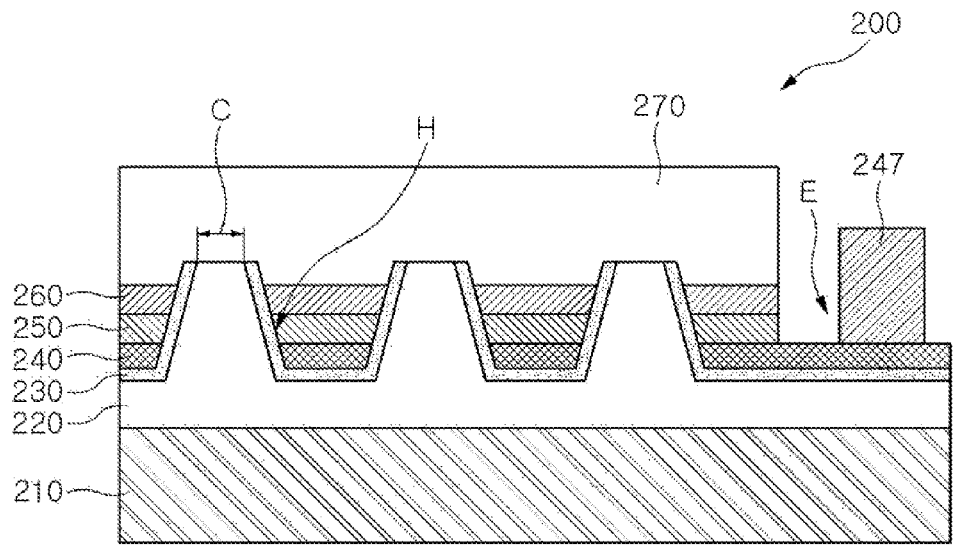

FIG. 9A is a plan view illustrating a light-emitting device according to an exemplary embodiment and FIG. 9B is a cross-sectional view taken along line I-I' in FIG. 9A.

According to FIGS. 9A and 9B, a semiconductor light-emitting device 200 may include a conductive substrate 210, a first electrode 220, an insulating layer 230, a second electrode 240, a second conductivity-type semiconductor layer 250, an active layer 260, and a first conductivity-type semiconductor layer 270, which are sequentially stacked. The first and second conductivity-type semiconductor layers 270 and 250 are a p-type nitride semiconductor layer and an n-type nitride semiconductor layer, respectively.

The conductive substrate 210 may be a metal or semiconductor substrate having electric conductivity. For example, the conductive substrate 210 may be a metal substrate including at least one of Au, Ni, Cu, and W, or a semiconductor substrate including at least one of Si, Ge, and GaAs.

The first electrode 220 may be disposed on the conductive substrate 210. A contact hole H may pass through the second electrode 240, the second conductivity-type semiconductor layer 250, and the active layer 260 to extend to a certain portion of the first conductivity-type semiconductor layer 270. The portion of the first electrode 220 may be connected to the first conductivity-type semiconductor layer 270 through the contact hole H. The conductive substrate 210 and the first conductivity-type semiconductor layer 270 may be electrically connected.

The second electrode 240 may be disposed to be connected to the second conductivity-type semiconductor layer 250. The second electrode 240 may be electrically isolated from the first electrode 220 by the insulating layer 230. As illustrated in FIG. 9B, the insulating layer 230 may be formed on a side surface of the contact hole H and between the first electrode 220 and the second electrode 240. Thus, the second electrode 240, the second conductivity-type semiconductor layer 250, and the active layer 260, exposed by the contact hole H, may be isolated from the second electrode 240.

A contact area C of the first conductivity-type semiconductor layer 270 may be exposed by the contact hole H, and the contact area C may be connected with a portion of the second electrode 240 through the contact hole H.

The second electrode 240 may provide an electrode-forming area E extended and exposed to an outside of a semiconductor laminate. The electrode-forming area E may include an electrode pad 247 configured to connect an external power to the second electrode 240. A plurality of electrode-forming areas E may be formed, as needed. To maximize a light-emitting area, the electrode-forming area E may be formed at an edge of the semiconductor light-emitting device 200 as illustrated in FIG. 9A. The second electrode 240 may include a material forming an ohmic contact with the second conductivity-type semiconductor layer 250 while having a higher reflectivity. The second electrode 240 may include the above-described reflective electrode material.

Figure 10:
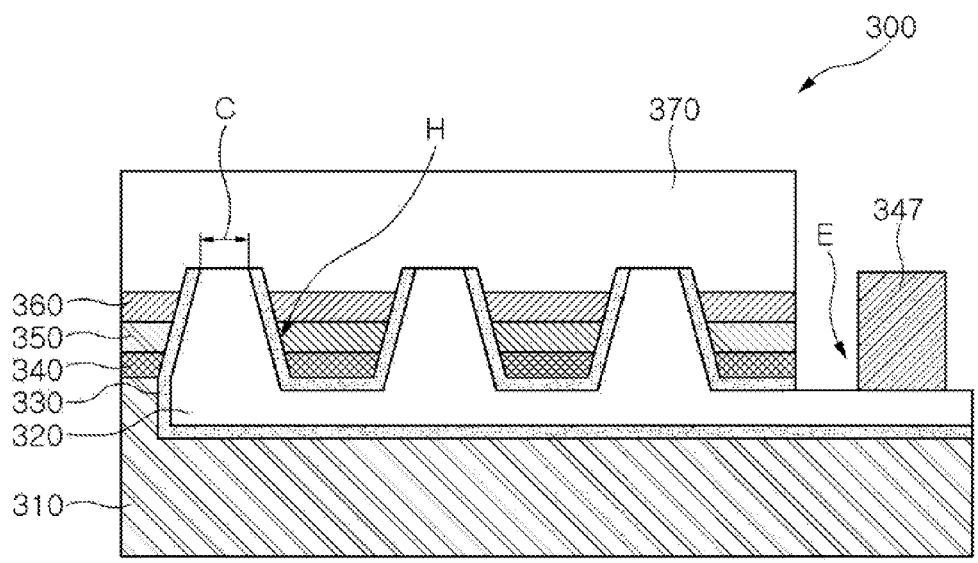
FIG. 10 is a cross-sectional view illustrating a semiconductor light-emitting device applicable to a white light emitting apparatus according to another exemplary embodiment.

Referring to FIG. 10, unlike the semiconductor light-emitting device 200 illustrated in FIG. 9B, in a nitride semiconductor light-emitting device 300, a first electrode 320 connected to a first conductivity-type semiconductor layer 370 may be exposed to an outside.

Similar to the above-described exemplary embodiment, the nitride semiconductor light-emitting device 300 illustrated in FIG. 10 may include a conductive substrate 310 and a semiconductor laminate including a second conductivity-type semiconductor layer 350, an active layer 360, and the first conductivity-type semiconductor layer 370. A second electrode 340 may be disposed between the second conductivity-type semiconductor layer 350 and the conductive substrate 310.

A contact hole H may be formed on the semiconductor laminate to expose a contact area C of the first conductivity-type semiconductor layer 370, and the contact area C may be connected to a portion of the first electrode 320. The first electrode 320 may be electrically isolated from the active layer 360, the second conductivity-type semiconductor layer 350, the second electrode 340, and the conductive substrate 310.

Unlike the above-described exemplary embodiment, the first electrode 320 may provide an electrode-forming area E extended and exposed to an outside of the semiconductor laminate, and an electrode pad 347 may be formed on the electrode-forming area E. In addition, the second electrode 340 may be directly connected to the conductive substrate 310 such that the conductive substrate 310 is provided as an electrode connected to the second conductivity-type semiconductor layer 350.

Figure 11:
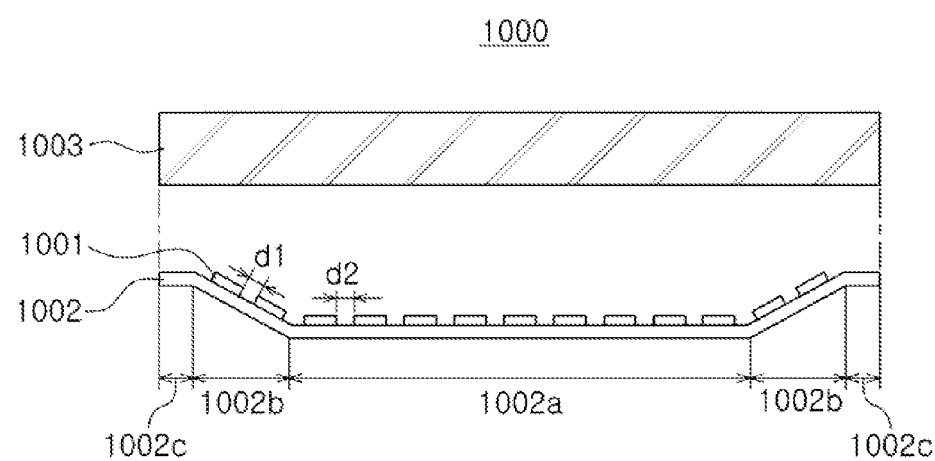
FIGS. 11 and 12 are cross-sectional views illustrating backlight units according to various exemplary embodiments.
Figure 12:
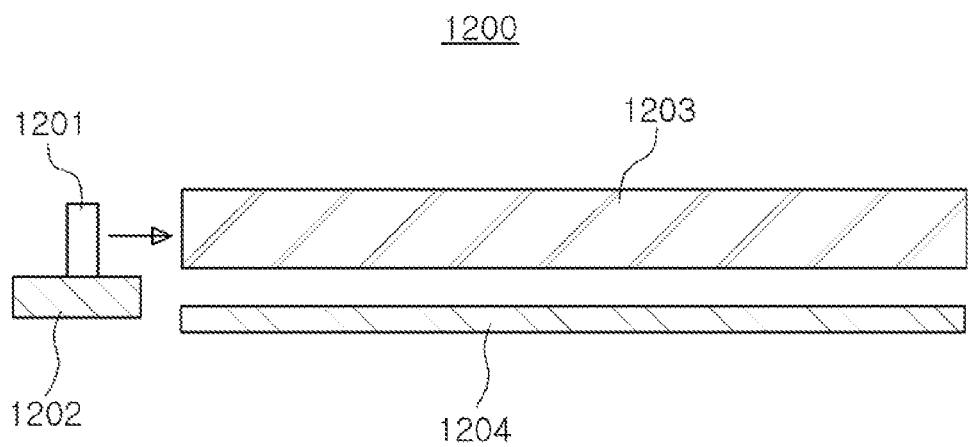

FIGS. 11 and 12 illustrate examples in which a semiconductor light-emitting device according to an exemplary embodiment is applied to a backlight unit.

Referring to FIG. 11, a backlight unit 1000 may include a light source 1001 mounted on a circuit board 1002, and one or more optical sheets 1003 disposed on the light source 1001.

The light source 1001 may correspond to a white light-emitting apparatus including a red phosphor according to an exemplary embodiment. For example, the light source 1001 mounted on the circuit board 1002 may include the light-source module 50 as illustrated in FIG. 8A or the light-source module 60 as illustrated in FIG. 8B.

The circuit board 1002 included in an exemplary embodiment may include a first flat area 1002a corresponding to a main portion of the circuit board 1002, an inclined area 1002b, at least a portion of which is inclined, disposed around the first flat area 1002a, and a second flat area 1002c disposed on an edge of the circuit board 1002, that is, an outer side of the inclined area 1002b. A plurality of light sources may be arranged at a first distance d1 therebetween on the first flat area 1002a, and one or more light sources may be arranged at a second distance d2 therebetween on the inclined area 1002b. The first distance d1 may be the same as the second distance d2. A width of the inclined area 1002b (or a length thereof in the cross-sectional view) may be smaller than a width of the first flat area 1002a and greater than a width of the second flat area 1002c. In addition, at least one light source 1001 may be disposed on the second flat area 1002c, as needed.

An angle of the inclined area 1002b with respect to the first flat area 1002a may be in the range greater than zero and smaller than 90 degrees. Due to this structure, the circuit board 1002 may maintain a uniform brightness even in an edge portion of the optical sheet 1003.

The light source 1001 in the backlight unit 1000 illustrated in FIG. 11 emits light toward a top surface where a liquid crystal display (LCD) is disposed. On the other hand, in a backlight unit 2000 illustrated in FIG. 12, a light source 1201 mounted on a substrate 1202 emits light in a lateral direction, and the emitted light may be incident to a light guide plate 1203 and converted to the form of surface light. Light passing through the light guide plate 1203 is emitted upwardly, and a reflective layer 1204 may be disposed on a bottom surface of the light guide plate 1203 to improve light extraction efficiency.

Figure 13:
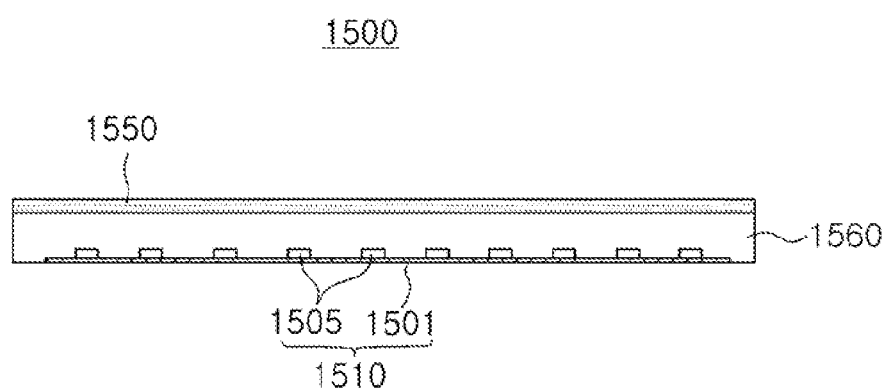
FIG. 13 is a cross-sectional view illustrating a direct-type backlight unit according to an exemplary embodiment.
Figure 14A:
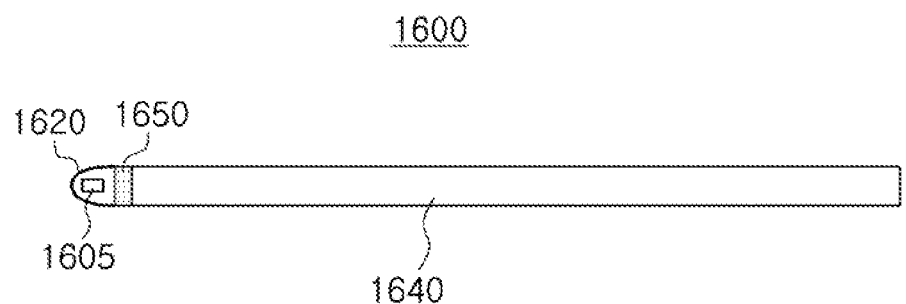
FIGS. 14A and 14B are cross-sectional views illustrating edge-type backlight units according to exemplary embodiments.
Figure 14B:
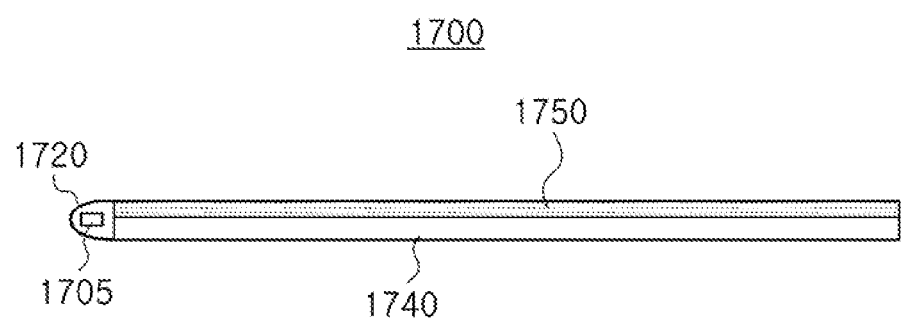

Unlike the above-described exemplary embodiments, a phosphor may not be directly disposed on a semiconductor light-emitting device or a package thereof, but may be disposed on another component of a backlight unit, as illustrated in FIGS. 13, 14A, and 14B.

As illustrated in FIG. 13, a direct-type backlight unit 1500 according to an exemplary embodiment may include a fluorescent film (or fluorescent member) 1550 and light source modules 1510 positioned under the fluorescent film 1550. The fluorescent film 1550 may include a red phosphor according to an exemplary embodiment.

The backlight unit 1500 illustrated in FIG. 13 may include a bottom case 1560 capable of accommodating the light source module 1510. In an exemplary embodiment, the fluorescent film 1550 may be disposed on an upper surface of the bottom case 1560. At least some of light emitted by the light source module 1510 may be wavelength-converted by the fluorescent film 1550. The fluorescent film 1550 may be applied in a form of a separately fabricated film, or provided in a form integrated with a light-spreading plate (or light spread sheet). The LED light source module 1510 may include a circuit board 1501 and a plurality of semiconductor light-emitting apparatuses 1505 mounted on an upper surface of the circuit board 1501. The semiconductor light-emitting apparatuses 1505 according to an exemplary embodiment may be semiconductor light-emitting apparatuses to which a phosphor is not applied.

FIGS. 14A and 14B illustrate an edge-type backlight unit according to another exemplary embodiment.

An edge-type backlight unit 1600 illustrated in FIG. 14A may include a light guide plate 1640 and a semiconductor light-emitting apparatus 1605 provided at a side of the light guide plate 1640. In the semiconductor light-emitting apparatus 1605, light may be guided into the light guide plate 1640 by a reflective structure 1620. In an exemplary embodiment, a fluorescent film 1650 may be disposed between the light guide plate 1640 and the semiconductor light-emitting apparatus 1605. The fluorescent film 1650 may include a red phosphor according to an exemplary embodiment.

An edge-type backlight unit 1700 illustrated in FIG. 14B may include a light guide plate 1740, a semiconductor light-emitting apparatus 1705 provided at a side of the light guide plate 1740, and a reflective structure 1720. In an exemplary embodiment, a fluorescent film 1750 may be disposed on a light-emitting surface of the light guide plate 1740. The fluorescent film 1750 may include a red phosphor according to an exemplary embodiment.

Accordingly, a red phosphor according to an exemplary embodiment may not be directly applied to the semiconductor light-emitting apparatus 1705 but may be applied to another component of the backlight unit 1700.

Figure 15:
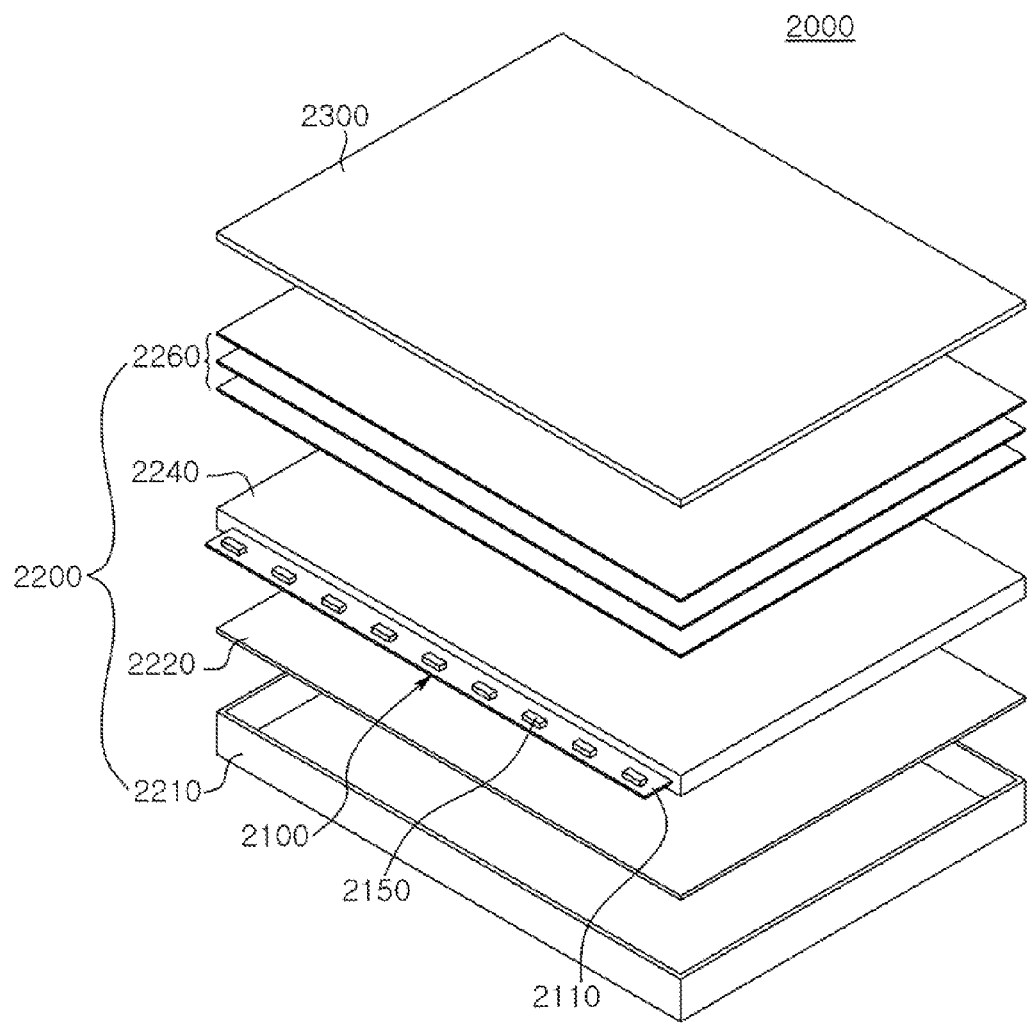
FIG. 15 is an exploded perspective view illustrating a display apparatus according to an exemplary embodiment.

FIG. 15 is an exploded perspective view illustrating a display apparatus according to an exemplary embodiment.

A display apparatus 2400 illustrated in FIG. 15 may include a backlight unit 2200 and an image display panel 2300 such as a liquid crystal panel. The backlight unit 2200 may include a light guide plate 2240 and an LED light source module 2100 disposed on at least one side surface of the light guide plate 2240.

In an exemplary embodiment, the backlight unit 2200 may further include a bottom case 2210 and a reflective plate 2220 disposed below the light guide plate 2240, as illustrated in FIG. 15.

To provide various optical characteristics, various kinds of optical sheets 2260, such as a diffusion sheet, a prism sheet, or a protection sheet, may be disposed between the light guide plate 2240 and the image display panel 2300.

The LED light source module 2100 may include a circuit board 2110 disposed on at least one side surface of the light guide plate 2240, and a plurality of semiconductor light-emitting apparatuses 2150 mounted on the circuit board 2110 and emitting light incident to the light guide plate 2240. The plurality of semiconductor light-emitting apparatuses 2150 may be a package including a red phosphor according to an exemplary embodiment. The plurality of semiconductor light-emitting apparatuses 2150 according to an exemplary embodiment may be a side-view light-emitting device package whose side surface adjacent to a light-emitting surface is mounted on the circuit board 2110.

FIG. 16 is an exploded perspective view of lighting apparatus including a semiconductor light-emitting device according to an exemplary embodiment.

The lighting apparatus 3000 is illustrated as a bulb-type lamp as an example, and includes a light-emitting module 3003, a driver 3008, and an external connection portion 3010. In addition, external structures, such as external and internal housings 3006 and 3009 and a cover 3007, may be further included.

The light-emitting module 3003 may include an LED light source 3001, that is, the above-described semiconductor light-emitting device, and a circuit board 3002 with the LED light source 3001 mounted thereon. For example, first and second electrodes of the semiconductor light-emitting device 3001 may be electrically connected to an electrode pattern of the circuit board 3002. In the exemplary embodiment, a single LED light source 3001 is mounted on the circuit board 3002, but a plurality of light sources 3001 may be mounted on the circuit board 3002 as needed. In addition, the light-emitting module 3003 may include a red phosphor according to an exemplary embodiment.

The external housing 3006 may operate as a heat dissipating unit, and include a heat dissipation plate 3004 in direct contact with the light-emitting module 3003 to enhance a heat dissipation effect, and a heat dissipation fin 3005 surrounding a side surface of the lighting apparatus 3000. The cover 3007 may be installed on the light-emitting module 3003, and have a convex lens shape. The driver 3008 may be installed in the internal housing 3009 and connected to the external connection portion 3010 in, for example, a socket structure, to receive power from an external power source.

In addition, the driver 3008 may function to convert the power to an appropriate current source capable of driving the semiconductor light-emitting device 3011 of the light-emitting module 3003. For example, the driver 3008 may be configured as an alternating current (AC)-direct current (DC) converter, a rectifying circuit component, or the like.

As set forth above, a red phosphor according to an exemplary embodiment may have a peak wavelength in a short wavelength band of a red band, and improve reliability as well as brightness. Such a red phosphor may be combined with another light-emitting component having a different wavelength to provide a white light-emitting apparatus emitting an excellent white light spectrum. In addition, the red phosphor may be widely applied to display apparatuses and lighting apparatuses.

While exemplary embodiments have been shown and described above, it will be apparent to those skilled in the art that modifications and variations could be made without departing from the scope of the invention as defined by the appended claims.

What is claimed is:

1. A red phosphor, comprising a nitride represented by a formula:
$(Sr_{1-x-y}Ba_xEu_y)_2Si_5N_8$, wherein, $0<x<0.7$ and $0.018<y<0.04$,
wherein a median particle size (D50) in a particle size distribution of the red phosphor is in a range of 10 μm to 25 μm, and
wherein, when a quartile deviation (Q.D.) related to a particle size is defined as (D75−D25)/(D75+D25), the particle size distribution of the red phosphor satisfies $0.18 \leq Q.D. \leq 0.32$.

2. The red phosphor of claim 1, wherein the red phosphor is configured to emit light having a peak wavelength in a range of 600 nm to 630 nm when irradiated by an excitation source, and
the excitation source is a blue light source having a dominant wavelength in a range of 420 nm to 470 nm.

3. The red phosphor claim 1, wherein the red phosphor comprises oxygen as an impurity, and a content of oxygen is 1 wt % or less.

4. The red phosphor of claim 1, wherein, in the formula, $0.19<x<0.6$.

5. A display device, utilizing the red phosphor according to claim 1 to convert a wavelength of light.

6. A white light emitting apparatus, comprising:
a semiconductor light-emitting device configured to emit excited light;
a red phosphor disposed around the semiconductor light-emitting device and configured to convert a wavelength of at least some of the excited light, wherein the red phosphor comprising a nitride represented by a formula $(Sr_{1-x-y}Ba_xEu_y)_2Si_5N_8$, wherein, $0<x<0.7$ and $0.018<y<0.04$, wherein a median particle size (D50) in a particle size distribution of the red phosphor is in a range of 10 μm to 25 μm, and when a quartile deviation (Q.D.) related to a particle size is defined as (D75−D25)/(D75+D25), the particle size distribution of the red phosphor satisfies $0.18<Q.D.<0.32$; and
at least one light-emitting component configured to provide light having a different wavelength from the excited light emitted by the semiconductor light-emitting device and light emitted by the red phosphor,
wherein the at least one light-emitting component comprises at least one from among another semiconductor light-emitting device and another phosphor.

7. The white light emitting apparatus of claim 6, wherein the semiconductor light-emitting device comprises a blue semiconductor light-emitting device having a main wavelength in a range of 420 nm to 470 nm.

8. The white light emitting apparatus of claim 7, wherein the at least one light-emitting component comprises a green phosphor.

9. The white light emitting apparatus of claim 8, wherein the green phosphor is configured to have a peak wavelength in a range of 500 nm to 550 nm.

10. The white light emitting apparatus of claim 8, wherein the green phosphor comprises at least one from among an oxide-based phosphor represented by a formula of $M_3Al_5O_{12}$, a β-sialon phosphor represented by a formula of $Si_{6-z}Al_zO_zN_{8-z}$, and a $La_3Si_6N_{11}$:Ce phosphor, wherein M comprises at least one selected from the group consisting of Y, Lu, Gd, Ga, Re, Mg, Ca, Sr, Ba, Zn, Eu, and Ce.

11. The white light emitting apparatus of claim 7, wherein the at least one light-emitting component comprises a yellow phosphor or a yellowish orange phosphor.

12. The white light emitting apparatus of claim 11, wherein the yellow phosphor or the yellowish orange phosphor has a peak wavelength in the range of 550 nm to 600 am.

13. The white light emitting apparatus of claim 11, wherein the yellow phosphor comprises at least one from among a silicate-based phosphor, a garnet-based phosphor, and a nitride-based phosphor, and the yellowish orange phosphor comprises a α-SiAlON:Re phosphor.

14. A display device, comprising:
an image display panel configured to display an image; and
a backlight unit configured to provide light to the image display panel and comprising a light emitting diode (LED) light-source module,
wherein the LED light-source module comprises a circuit board, and the white light emitting apparatus according to claim 6.

15. A lighting apparatus, comprising:
a light emitting diode (LED); and
a spread sheet configured to uniformly spread light incident from the LED,
wherein the LED comprises a circuit board and a white light emitting apparatus according to claim 6, mounted on the circuit board.

16. A backlight unit (BLU) of a display apparatus, the BLU comprising:
a light emitting diode (LED) configured to emit light; and
a fluorescent member configured to convert a wavelength of the light emitted from the LED and emit light having the converted wavelength, the fluorescent member comprising a red phosphor, which comprises a nitride represented by a formula $(Sr_{1-x-y}Ba_xEu_y)_2Si_5N_8$, wherein, $0<x<0.7$ and $0.018<y<0.04$, wherein a median particle size (D50) in a particle size distribution of the red phosphor is in a range of 10 μm to 25 μm, and when a quartile deviation (Q.D.) related to a particle size is defined as (D75−D25)/(D75+D25), the particle size distribution of the red phosphor satisfies $0.18<Q.D.<0.32$.

17. The BLU of claim 16, wherein the LED is configured to emit blue light and the fluorescent member is configured to convert a wavelength of the blue light to a wavelength of red light.

* * * * *